(12) United States Patent
Bui et al.

(10) Patent No.: US 7,656,001 B2
(45) Date of Patent: Feb. 2, 2010

(54) FRONT-SIDE ILLUMINATED, BACK-SIDE CONTACT DOUBLE-SIDED PN-JUNCTION PHOTODIODE ARRAYS

(75) Inventors: Peter Steven Bui, Westminster, CA (US); Narayan Dass Taneja, Long Beach, CA (US)

(73) Assignee: UDT Sensors, Inc., Hawthorne, CA (US)

( * ) Notice: Subject to any disclaimer, the term of this patent is extended or adjusted under 35 U.S.C. 154(b) by 171 days.

(21) Appl. No.: 11/555,367

(22) Filed: Nov. 1, 2006

(65) Prior Publication Data
US 2008/0099871 A1 May 1, 2008

(51) Int. Cl.
H01L 31/06 (2006.01)
(52) U.S. Cl. .................... 257/461; 257/459
(58) Field of Classification Search .......... 257/461, 257/459
See application file for complete search history.

(56) References Cited

U.S. PATENT DOCUMENTS

| | | |
|---|---|---|
| 3,041,226 A | 6/1962 | Pennington |
| 3,713,921 A | 1/1973 | Fleischer et al. |
| 3,765,969 A | 10/1973 | Kragness et al. |
| 3,801,390 A | 4/1974 | Lepselter et al. |
| 3,808,068 A | 4/1974 | Johnson et al. |
| 4,210,923 A | 7/1980 | North et al. |
| 4,290,844 A | 9/1981 | Rotolante et al. |
| 4,874,939 A | 10/1989 | Nishimoto et al. |
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,049,962 A | 9/1991 | Huang et al. |
| 5,053,318 A | 10/1991 | Gulla et al. |

(Continued)

FOREIGN PATENT DOCUMENTS

EP 0 347 157 12/1989

(Continued)

OTHER PUBLICATIONS

Y. Atatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., vol. 31, pp. 2098-2100, 1995.

(Continued)

Primary Examiner—Mark Prenty
(74) Attorney, Agent, or Firm—PatentMetrix

(57) ABSTRACT

The present invention is a photodiode detector array for use in computerized tomography (CT) and non-CT applications. Specifically, the present invention is a high-density photodiode arrays, with low dark current, low capacitance, high signal to noise ratio, high speed, and low crosstalk that can be fabricated on relatively large substrate wafers. More specifically the photodiode array of the present invention is fabricated such that the PN-junctions are located on both the front side and back side surfaces of the array, and wherein the front side PN-junction is in electrical communication with the back side PN-junction. Still more specifically, the present invention is a photodiode array having PN-junctions that are electrically connected from the front to back surfaces and which can be operated in a fully depleted mode at low reverse bias.

15 Claims, 15 Drawing Sheets

U.S. PATENT DOCUMENTS

| | | | |
|---|---|---|---|
| 5,144,379 | A | 9/1992 | Eshita et al. |
| 5,214,276 | A | 5/1993 | Himoto et al. |
| 5,237,197 | A | 8/1993 | Snoeys et al. |
| 5,252,142 | A | 10/1993 | Matsuyama et al. |
| 5,254,480 | A | 10/1993 | Tran |
| 5,276,955 | A | 1/1994 | Noddin et al. |
| 5,408,122 | A | 4/1995 | Reele |
| 5,430,321 | A | 7/1995 | Effelsberg |
| 5,446,751 | A | 8/1995 | Wake |
| 5,501,990 | A | 3/1996 | Holm et al. |
| 5,576,559 | A | 11/1996 | Davis |
| 5,599,389 | A | 2/1997 | Iwasaki |
| 5,656,508 | A | 8/1997 | So et al. |
| 5,818,096 | A | 10/1998 | Ishibashi et al. |
| 5,825,047 | A | 10/1998 | Ajisawa et al. |
| 5,869,834 | A | 2/1999 | Wipenmyr |
| 5,889,313 | A | 3/1999 | Parker |
| 5,923,720 | A | 7/1999 | Barton et al. |
| 5,928,438 | A | 7/1999 | Salami et al. |
| 6,027,956 | A | 2/2000 | Irissou |
| 6,175,141 | B1* | 1/2001 | Hofbauer et al. ............ 257/444 |
| 6,218,684 | B1 | 4/2001 | Kuhara et al. |
| 6,326,300 | B1 | 12/2001 | Liu et al. |
| 6,326,649 | B1 | 12/2001 | Chang et al. |
| 6,352,517 | B1 | 3/2002 | Flock et al. |
| 6,426,991 | B1 | 7/2002 | Mattson et al. |
| 6,438,296 | B1 | 8/2002 | Kongable |
| 6,489,635 | B1 | 12/2002 | Sugg |
| 6,504,158 | B2 | 1/2003 | Possin |
| 6,510,195 | B1 | 1/2003 | Chappo et al. |
| 6,546,171 | B2 | 4/2003 | Fukutomi |
| 6,569,700 | B2 | 5/2003 | Yang |
| 6,593,636 | B1 | 7/2003 | Bui et al. |
| 6,670,258 | B2 | 12/2003 | Carlson et al. |
| 6,734,416 | B2 | 5/2004 | Carlson et al. |
| 6,772,729 | B2 | 8/2004 | Brosseau et al. |
| 6,826,080 | B2 | 11/2004 | Park et al. |
| 7,057,254 | B2 | 6/2006 | Bui et al. |
| 7,112,465 | B2 | 9/2006 | Goushcha et al. |
| 7,256,470 | B2 | 8/2007 | Bui et al. |
| 7,279,731 | B1 | 9/2007 | Bui et al. |
| 2001/0034105 | A1 | 10/2001 | Carlson |
| 2002/0056845 | A1 | 5/2002 | Iguchi et al. |
| 2004/0104351 | A1 | 6/2004 | Shibayama |
| 2004/0206886 | A1 | 10/2004 | Carlson et al. |
| 2004/0222358 | A1 | 11/2004 | Bui et al. |
| 2004/0222482 | A1* | 11/2004 | Bui et al. ............ 257/461 |
| 2004/0241897 | A1 | 12/2004 | Rhee et al. |
| 2004/0262652 | A1 | 12/2004 | Goushcha et al. |
| 2006/0220078 | A1 | 10/2006 | Bui et al. |
| 2006/0255420 | A1 | 11/2006 | Bui et al. |
| 2006/0278898 | A1 | 12/2006 | Shibayama |
| 2007/0090394 | A1 | 4/2007 | Bui et al. |
| 2007/0257329 | A1 | 11/2007 | Bui et al. |
| 2007/0278534 | A1 | 12/2007 | Bui et al. |
| 2007/0296005 | A1 | 12/2007 | Bui et al. |
| 2008/0067622 | A1 | 3/2008 | Bui et al. |
| 2008/0099871 | A1* | 5/2008 | Bui et al. ............ 257/461 |
| 2008/0128846 | A1 | 6/2008 | Bui et al. |
| 2008/0277753 | A1 | 11/2008 | Bui et al. |

FOREIGN PATENT DOCUMENTS

| | | |
|---|---|---|
| EP | 0436282 | 7/1991 |
| EP | 0 723 301 A2 | 5/1997 |
| EP | 1 069 626 A2 | 1/2001 |
| EP | 1 205 983 A1 | 5/2002 |
| WO | WO/00/52766 | 9/2000 |

OTHER PUBLICATIONS

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

* cited by examiner

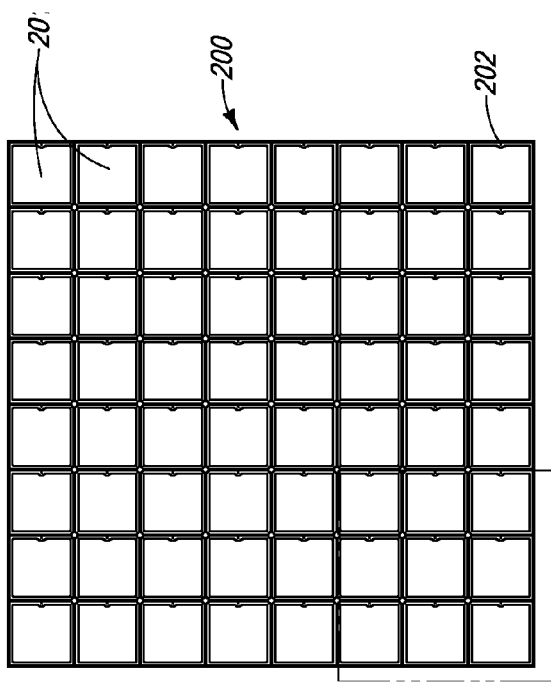
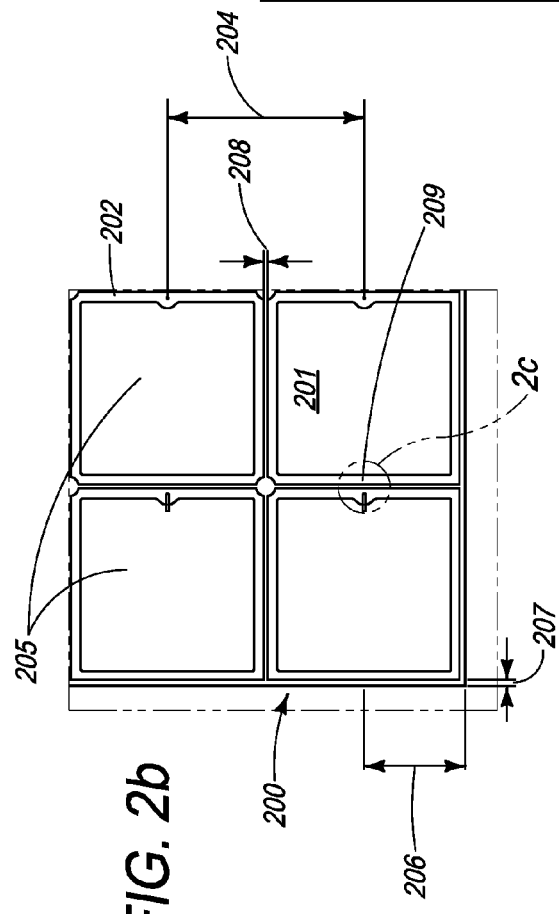
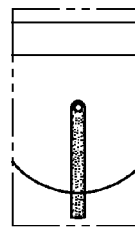
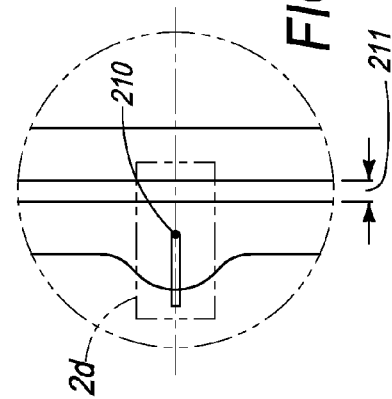

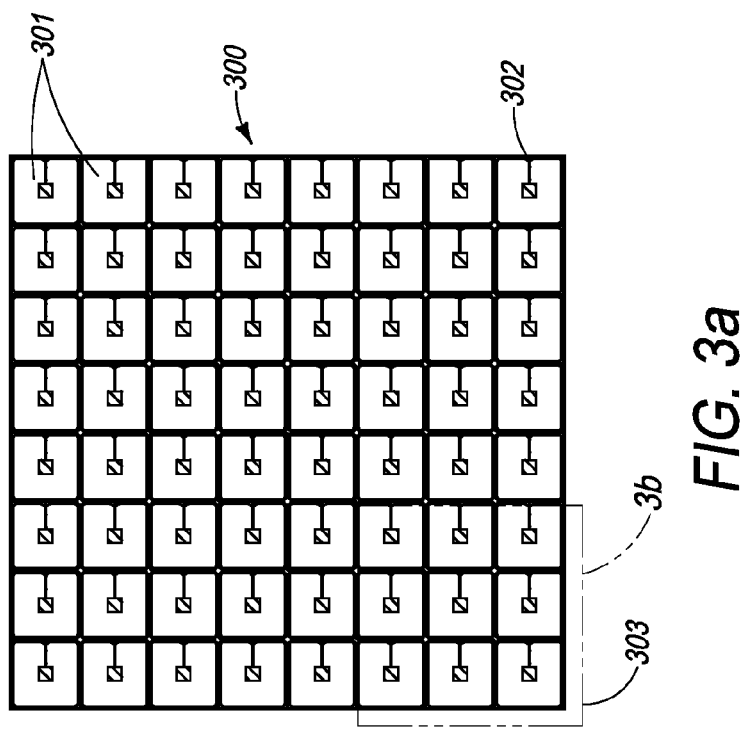
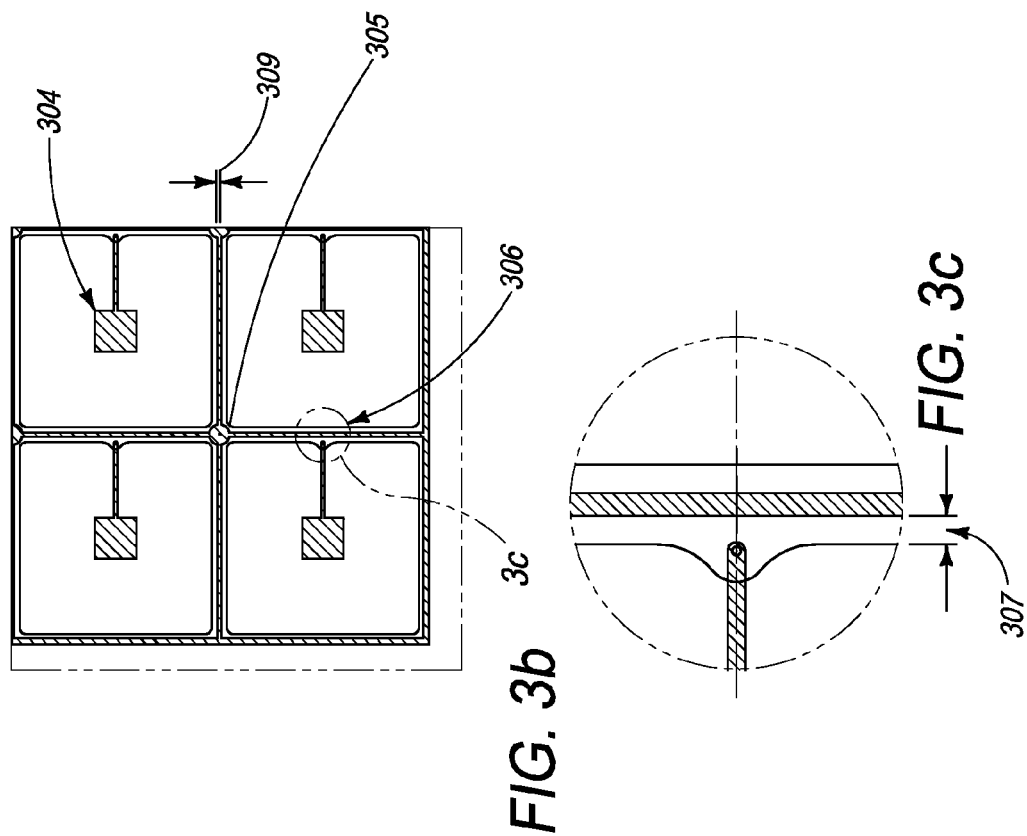
FIG. 3a
FIG. 3b
FIG. 3c

Step 465

Step 470

Step 475

Step 480

Step 485

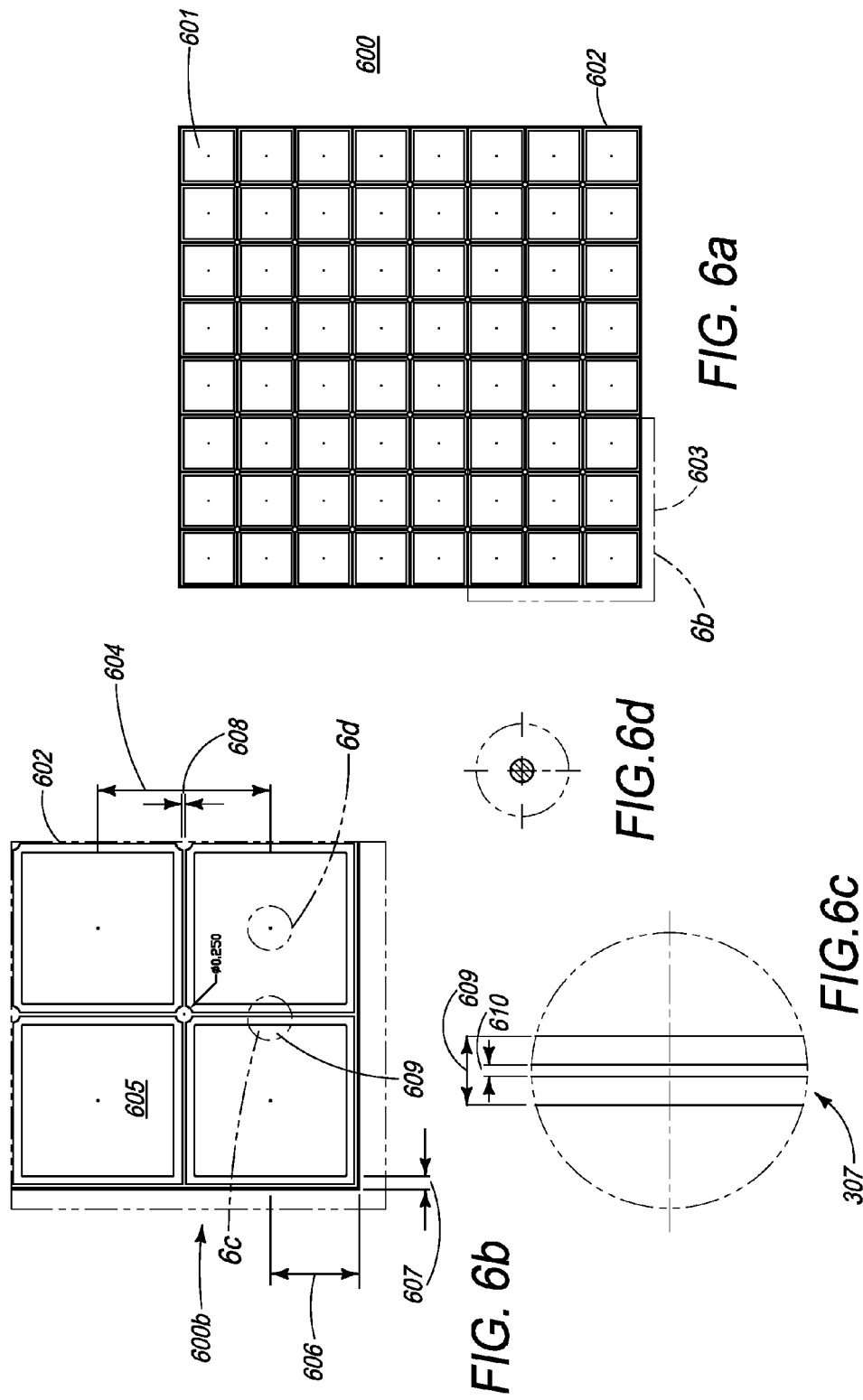

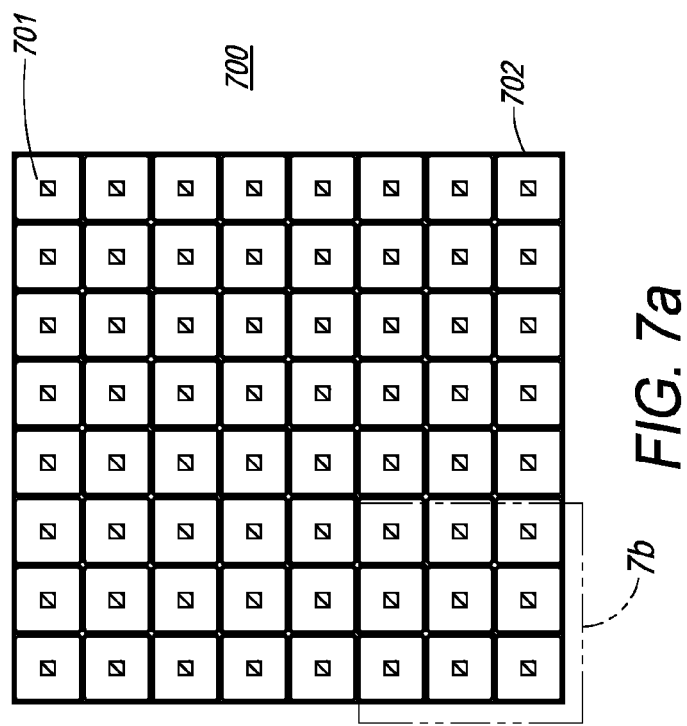
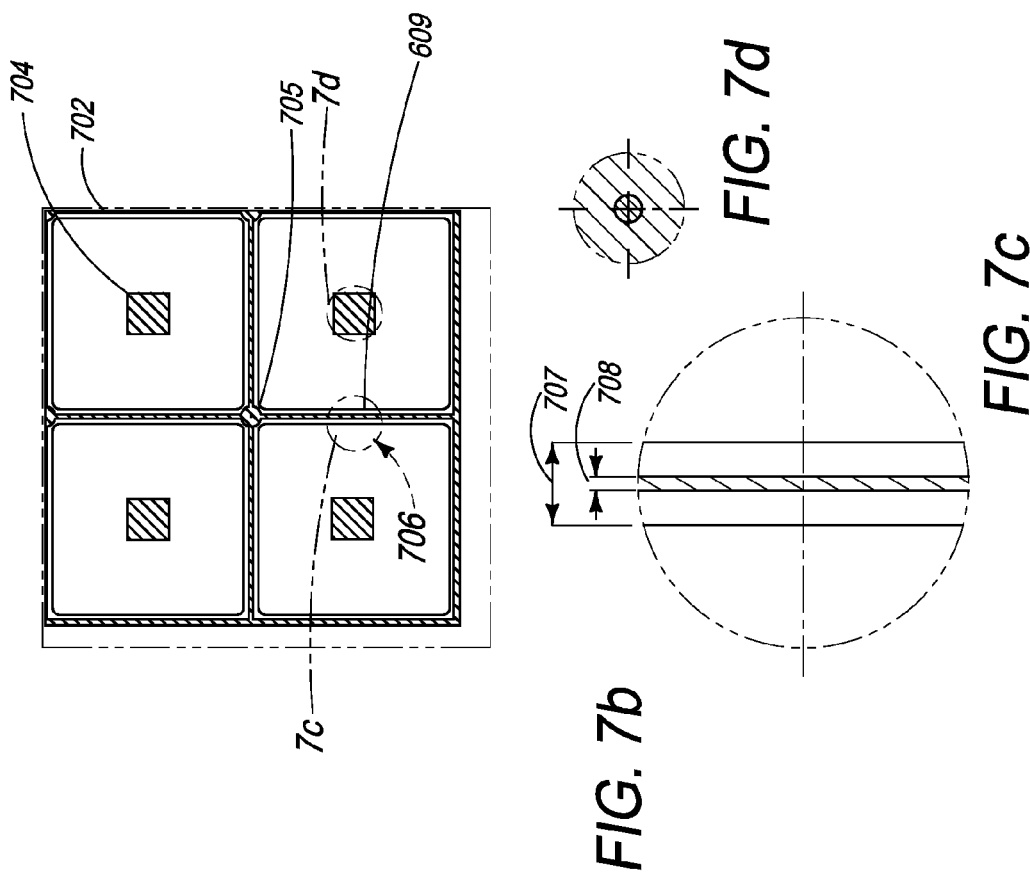
FIG. 7a
FIG. 7b
FIG. 7c
FIG. 7d

Step 860

Step 865

Step 870

Step 875

Step 880

Step 885

FRONT-SIDE ILLUMINATED, BACK-SIDE CONTACT DOUBLE-SIDED PN-JUNCTION PHOTODIODE ARRAYS

FIELD OF THE INVENTION

The present invention is directed towards thin wafer photodiodes having improved strength and handling characteristics. Specifically, the present invention is directed towards novel photodiodes and methods of making novel photodiodes that can be feasibly fabricated using thin wafers while still maintaining the overall performance characteristics of the photodiode array and individual diode units. Still more specifically, the photodiode arrays of the present invention have PN-junctions that are electrically connected from the front to back surfaces, and thus, can be operated in a fully depleted mode at low reverse bias.

BACKGROUND OF THE INVENTION

Photodiodes are typified by the quantification of certain characteristics, such as electrical, optical, current (I), voltage (V), and noise. Electrical characteristics predominantly include shunt resistance, series resistance, junction capacitance, rise or fall time and frequency response whereas optical characteristics include responsivity, quantum efficiency, non-uniformity, and non-linearity. Noise in photodiodes is generated by a plurality of sources including, but not limited to, thermal noise, quantum or photon or shot noise, and flicker noise.

In the semiconductor industry it is often desirable to increase light-induced current of photodiodes in order to increase the signal-to-noise ratio and thereby enhance photodiode sensitivity. Photodiode sensitivity is crucial in low light-level applications and is typically quantified by noise equivalent power (NEP) defined as the optical power that produces a signal-to-noise ratio of unity at the detector output. NEP is usually specified at a given wavelength and over a frequency bandwidth of 1 Hz and is therefore expressed in units of $W/Hz^{1/2}$.

Silicon photodiodes, essentially active solid-state semiconductor devices, are among the most popular photodetectors coalescing high performance over a wide wavelength range with unmatched user-friendliness. For example, silicon photodiodes are sensitive to light in the wide spectral range, approximately $200*10^{-9}$ m to $1200*10^{-9}$ m, extending from deep ultraviolet all the way through visible to near infrared. Additionally, silicon photodiodes detect the presence or absence of minute light intensities thereby facilitating extremely precise measurement of the same on appropriate calibration. For instance, appropriately calibrated silicon photodiodes detect and measure light intensities varying over a wide range, from very minute light intensities of below $10^{-13}$ watts/cm$^2$ to high intensities above $10^{-3}$ watts/cm$^2$.

Photodiode arrays or photodiodes are used in an assortment of applications including, but not limited to, radiation detection, optical position encoding, and low light-level imaging, such as night photography, nuclear medical imaging, photon medical imaging, multi-slice computer tomography (CT) imaging, and ballistic photon detection etc. Typically, photodiode arrays may be formed as one-or two-dimensional arrays of aligned photodiodes, or, for optical shaft encoders, a circular or semicircular arrangement of diodes.

Conventional computed tomography (CT) scanners and digital radiography systems use large numbers of X-ray detectors, on the order of several hundred to several thousand, in which each X-ray detector includes a scintillator to convert X-rays into light and a photocell to convert the light into an electrical signal. In such systems, it is preferred that the detectors are high density and that the detectors have equal pitch, i.e. the center-to-center distance from detector to detector is equal. Thus, the detectors are located as close as possible to one another, resulting in a detection system which has a high detection efficiency so that a patient is exposed to only the minimum amount of X-rays required to produce a satisfactory image. As the devices become smaller, however, it becomes more difficult to provide efficient interconnections between devices, thus negating the benefits of the smaller device size.

The prior art discloses attempts to design, fabricate, and implement high-density semiconductor arrays. For example, U.S. Pat. No. 5,501,990, assigned to Motorola, Inc. discloses, "a method of fabricating a high density light emitting diode array with semiconductor interconnects comprising the steps of: providing a substrate of non-conductive material with a major surface, a conductive layer of material on the major surface of the substrate, a first carrier confinement layer on the conductive layer, an active layer on the first carrier confinement layer and a second carrier confinement layer on the active layer; separating portions of the second carrier confinement layer, the active layer and the first carrier confinement layer into a plurality of light emitting diodes positioned in rows and columns and separating the conductive layer into a plurality of columns connecting a first contact of each light emitting diode in a column to a first contact of each other light emitting diode in the column; forming column contacts connected to the conductive layer at an end of each column; and forming a second contact on the cap layer of each light emitting diode and connecting second contacts for each light emitting diode in a row to the second contacts of all other light emitting diodes in the row."

U.S. Pat. No. 5,656,508, also assigned to Motorola, Inc. discloses, "a method of fabricating a two-dimensional organic light emitting diode array for high density information image manifestation apparatus comprising: providing an electrically insulative substrate with a planar surface; depositing a layer of electrically conductive material on the planar surface of the substrate; patterning the layer of electrically conductive material to form a plurality of laterally spaced, conductive strips defining first electrodes; depositing a layer of dielectric medium on a surface of the conductive strips and the planar surface of the substrate; depositing a layer of photoresist on the layer of dielectric medium; patterning the photoresist using a cavity defining mask to expose portions of the dielectric medium; etching away the exposed portions of the dielectric medium to form a plurality of laterally spaced cavities, each of the plurality of cavities being positioned on an associated one of the defined first electrodes and exposing therein the associated first electrode; striping off the photoresist; depositing in each of the cavities an electroluminescent medium in the successive order of a layer of hole transporting material, a layer of active organic emitter, a layer of electron transporting material and a layer of a low work functional metal; depositing a layer of ambient stable metal on the dielectric medium so as to sealingly overlie each of the cavities and electrically contact the layer of low work function metal in the cavities; and patterning the layer of ambient stable metal into metal strips in a direction orthogonal to the conductive strips so as to define second electrodes sealing each of the plurality of cavities."

In addition to the high cost of manufacturing and low throughput, another typical problem with high-density integration of conventional photodiode arrays is the amount and extent of crosstalk that occurs between adjacent detector structures, primarily as a result of minority carrier current between diodes. The problem of crosstalk between diodes becomes even more acute as the size of the photodiode arrays, the size of individual detectors comprising the arrays, the spatial resolution, and the spacing of the photodiodes is reduced.

In certain applications, it is desirable to produce optical detectors having small lateral dimensions and spaced closely together. For example in certain medical applications, it would beneficial to increase the optical resolution of a detector array in order to permit for improved image scans, such as computer tomography scans. However, at conventional doping levels utilized for diode arrays of this type, the diffusion length of minority carriers generated by photon interaction in the semiconductor is in the range of at least many tens of microns, and such minority carriers have the potential to affect signals at diodes away from the region at which the minority carriers were generated. Therefore, the spatial resolution obtainable may be limited by diffusion of the carriers within the semiconductor itself, even if other components of the optical system are optimized and scattered light is reduced.

It is difficult, however, to generate thin wafer photodiodes in which leakage current and noise is controlled and the wafer is sufficiently sturdy to handle processing and use is difficult. Popular applications including, but not limited to, computer tomography (CT), utilize thin wafer photodiode arrays produced on large diameter wafers. The production of such arrays is often plagued by excessive loss due to breakage of the delicate thin wafers.

In addition, as photodiode detector devices become smaller, it becomes more difficult to provide efficient interconnections between devices, thus putting an additional demand on device electrical requirements. The prior art has attempted to manage interconnect density by forming dense metal interconnect patterns, because high-density VLSI and ULSI devices typically require multiple levels of surface metallization in order to accommodate their complex wiring patterns. Multiple level metallization creates planarity problems in the metallization layers, however, thereby limiting interconnection density. Complex process steps are also needed to provide multiple levels of metallization.

For example, U.S. Pat. No. 5,276,955, assigned to Supercomputer Systems Limited Partnership discloses "a method for forming a multilayer substrate having high density area array interconnects, the method comprising the steps of: (a) providing three or more pre-assembled subsections, each subsection comprising: a planar substrate having a pair of generally planar exposed surfaces and being comprised of a dielectric medium having a plurality of conductive layers disposed therein, the conductive layers including: at least one power layer; and at least one X-Y signal pair layer; and a pad layer on at least one of the surfaces of the planar substrate, the pad layer comprising a plurality of metallic interconnect pads disposed on the surface of the planar substrate such that an exposed surface of the interconnect pads is raised above the exposed surface of the dielectric medium surrounding the interconnect pads, each of the interconnect pads being selectively connected to one or more conductive regions in the signal pair layer or the power layer; (b) stacking the three or more pre-assembled subsections together such that the interconnect pads on the pad layer of one subsection align with the interconnect pads on the pad layer of an adjacent subsection; and (c) electrically and mechanically joining the three or more pre-assembled subsections in a simultaneous manner to concurrently form the multilayer substrate by metallurgically bonding the interconnect pads on adjacent subsections without bonding the surrounding dielectric medium."

The prior art, however, fails to provide a thin wafer photodiode structure and method of manufacturing that produces sufficiently sturdy wafers while still maintaining the overall performance characteristics of photodiode arrays and their individual diode units, within detection systems.

More specifically, in CT applications, the power supply for advanced ASIC circuits is typically 5 volts; therefore, the maximum reverse bias available for the photodiode is also 5 volts. Using conventional technology, a photodiode array fabricated on bulk silicon material cannot be fully depleted at 5 volts. While it is easy to fully deplete a device at high bias, it is almost impossible to fully deplete a bulk silicon device at very low bias.

Consequently, there is still a need for economically, technically, and operationally feasible methods, apparatuses, and systems for manufacturing thin wafer photodiode arrays. More exclusively, there is demand for cost-effective computer tomography (CT) scanner photodiode array while still maintaining the overall performance characteristics of the photodiode array and individual diode units.

In particular, what is needed is a specially structured photodiode array that can be operated in a fully depleted mode at low reverse bias. More specifically, what is needed is a photodiode array having PN-junctions that are electrically connected from the front to back surfaces such that is can be operated in a fully depleted mode at low reverse bias.

SUMMARY OF THE INVENTION

The present invention describes several embodiments of a novel photodiode array and methods making the novel photodiode arrays that can be feasibly fabricated using thin wafers while still maintaining the overall performance characteristics of the photodiode array and individual diode units. More specifically, the photodiode arrays of the present invention have PN-junctions that are electrically connected from the front to back surfaces, and thus, can be operated in a fully depleted mode at low reverse bias.

In one embodiment, the present invention is a photodiode comprising a substrate with at least a front side and a back side; at least one PN-junction on the front side; at least one PN-junction on the back side; at least one conduit for forming an electrical connection from a PN-junction on the front side of the substrate to a PN-junction on the back side of the substrate.

In one embodiment, the photodiode conduit further comprises an insulation layer formed from silicon dioxide. In addition, the photodiode conduit comprises a conductive layer deposited on the insulation layer, where the conductive layer is formed from doped polysilicon and thus, enables enables electrical communication between the front side and back side. In another embodiment, the conduit comprises a p+ dopant layer and a polysilicon or polyimide filling.

In one embodiment, the present invention is a method of manufacturing a semiconductor device comprising the steps of performing a mask oxidation on a front side and a back side of a device wafer; implementing n+ photolithography on the front and back sides; performing n+ diffusion followed by drive-in oxidation on the front and back sides; forming a conduit from the back side to the front side, wherein said conduit is for enabling an electrical connection; growing an oxide layer on said front side, said back side, and conduit; implementing a first p+ area photolithography on the front side and the back side; growing a passivation layer on the front side and back side; implementing a p+ mask lithography on the front side for etching contact windows on the front side; performing p+ ion implantation on the front side and back side to form a PN-junction; depositing a polysilicon layer to fill the conduit and subsequently etching the polysilicon from at least portions of the front and back side; implementing contact window lithography on the back side; and performing metal deposition followed by etching the metal on the back side.

In one embodiment, the starting material device wafer has a diameter of 5 inches. In another embodiment, the semiconductor device wafer starting material has a diameter of 6 inches. In one embodiment, the device wafer starting material has a thickness in the range of 0.210 mm to 0.260 mm. In one embodiment, the device wafer starting material has a resistivity of 8000 $\Omega$cm.

In one embodiment, the step of forming a conduit from the back side to the front side is achieved by reactive ion etching. In another embodiment, the step of forming a conduit from the back side to the front side is achieved by laser hole drilling.

The aforementioned and other embodiments of the present invention shall be described in greater depth in the drawings and detailed description provided below.

BRIEF DESCRIPTION OF THE DRAWINGS

These and other features and advantages of the present invention will be appreciated, as they become better understood by reference to the following detailed description when considered in connection with the accompanying drawings, wherein:

FIGS. 2a-2d represent front side views of a first embodiment of a photodiode array with double-sided PN junctions formed in accordance with the present invention;

FIGS. 3a-3c represent back side views of a first embodiment of a photodiode array with double-sided PN junctions formed in accordance with the present invention;

FIGS. 6a-6d represent front side views of a second embodiment of a photodiode array with double-sided PN junctions formed in accordance with the present invention;

FIGS. 7a-7d represent back side views of a second embodiment of a photodiode array with double-sided PN junctions formed in accordance with the present invention.

DETAILED DESCRIPTION OF THE INVENTION

The present invention is directed towards detector structures, detector arrays, and design and implementation of detector arrays for an assortment of applications including, but not limited to, computerized tomography (CT) and non-CT applications. Specifically, the present invention is directed towards high-density photodiode arrays, with low dark current, low capacitance, high signal to noise ratio, high speed, and low crosstalk that can be fabricated on relatively large substrate wafers. More specifically the photodiode array of the present invention is fabricated such that the PN-junctions are located on both the front side and back side surfaces of the array, wherein the front side PN-junction is in electrical communication with the back side PN-junction. Still more specifically, the front side PN-junction is in electrical communication with the back side PN-junction via a conduit that is drilled into the substrate via an appropriate method, as described in detail below. Thus, the present invention is also directed towards photodiode arrays having PN-junctions that are electrically connected from the front to back surfaces and which can be operated in a fully depleted mode at low reverse bias.

In addition, the present invention is directed towards several embodiments of a front-side illuminated, back-side contact double-sided PN-junction photodiodes, optionally organized in the form of an array, including a plurality of p+ and n+ diffused regions. Specifically, the present invention is directed towards several embodiments of a photodiode array having PN-junctions on both the front side and back side surfaces, wherein the PN-junctions are in electrical communication.

The present invention is also directed towards the fabrication of thin wafer photodiodes using the physical support provided by n+ diffused layer and/or p+ diffused layer. Consequently, the present invention delivers high device performance characteristics, such as low crosstalk, low radiation damage, high speed, low leakage dark current and high speed, using a thin active layer. More specifically, in CT applications, desired, but not required, characteristics include high density photodiode arrays with low dark current (on the order of 20 pA when the CT photodiode array device is operated in fully depleted mode), low capacitance (on the order of 5 pF at 5 volts operational voltage) and low crosstalk (on the order of 0.1% at 5 volts).

Reference will now be made in detail to specific embodiments of the invention. While the invention will be described in conjunction with specific embodiments, it is not intended to limit the invention to one embodiment.

Figure 1:
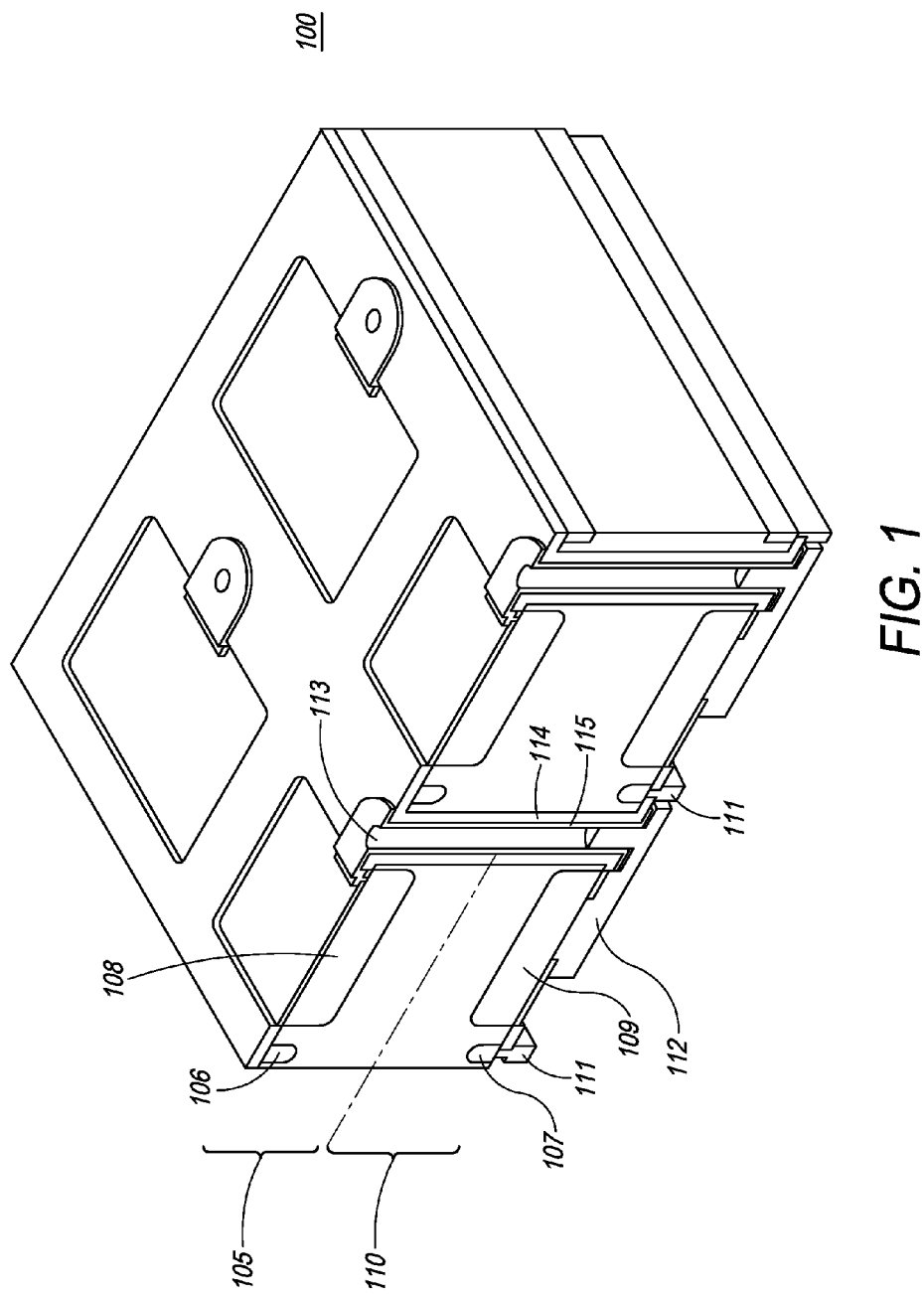
FIG. 1 is a cross-sectional view of a first embodiment of a photodiode array with double-sided PN junctions formed in accordance with the present invention.

FIG. 1 is a cross-sectional view of a first embodiment of a front-side illuminated, back-side contact (FSL-BSC) double-sided PN-junction photodiode array formed in accordance with the present invention. In one embodiment, photodiode array 100 is preferably formed from a device wafer of suitable semiconductor material. For example, but, not limited to such example, a silicon wafer is used as the starting material for the photodiode array of the present invention. In one embodiment, the starting material is a silicon wafer having the following specifications: a 6-inch diameter; a thickness ranging from 0.210-0.260 mm; n-type conductivity; and a resistivity on the order of 8000 $\Omega$cm. In another embodiment, the starting material is a silicon wafer having the following specifications: a 5-inch diameter; a thickness ranging from 0.210-0.260 mm; n-type conductivity; and a resistivity on the order of 8000 $\Omega$cm. The above specifications are merely for the purposes of illustration, and are not limiting. Consequently these specifications may be modified to suit the design, fabrication and functional requirements suggested herein.

In one embodiment, photodiode array 100 is formed from a silicon wafer having a 6-inch diameter; a thickness of approximately 0.230 mm; n-type conductivity; and a resistivity on the order of 8000 $\Omega$cm. As shown in FIG. 1, for illustration purposes, at least a portion of photodiode array 100 is divided into two regions, front-side region 105 and back side region 110. It should be understood by those of ordinary skill in the art that the above specifications are not limited to those recommended herein and can be easily changed to suit varying design, fabrication, and functional requirements suggested herein.

In one embodiment, the front side region 105 and back side region 110 comprise a plurality of doped regions. Preferably, adjacent doped regions are of different impurities of different conductivity types. For example, but not limited to such example, front side region 105 and back side region 110 may comprise doped regions 106 and 107, respectively, doped with a suitable impurity of a first conductivity type, such as either p-type or n-type. In addition, front side region 105 and back side region 110 further comprise doped regions 108 and 109, respectively, doped with a suitable impurity of a second conductivity type, opposite that of the first conductivity type, either p-type or n-type.

For example, but not limited to such example, if regions 106 and 107 are doped with a suitable impurity of a first conductivity type wherein the first conductivity type is n-type, then regions 108 and 109 are doped with a suitable impurity of a second conductivity type, wherein the second conductivity type is p-type. The first embodiment will be described with respect to this scenario, but it should be noted herein that the photodiode array of the present invention and method of manufacturing the same is not limited to the embodiment described herein.

In one embodiment, the present invention comprises PN-junctions on both front side 105 and back side 110 the device wafer. While boron (B) and phosphorus (P) are the preferred p-type and n-type dopants employed to create the p+ and n+ regions, it should be understood to those of ordinary skill in the art that any suitable doping material may be used. Preferably, doped diffusion regions 106, 107 have a depth of 1 μm and doped diffused regions 108 and 109 have a depth of 0.5 μm.

Referring back to FIG. 1, in one embodiment, back side n+ region 107 is in electrical communication with a metallic area, region, or pad to form at least one back side cathode 111. In another embodiment, back side p+ region 109 is in electrical communication, preferably at a plurality of points, with a metallic area, region, or pad to form a back side anode 112.

In addition, the PN-junctions on both the front side and back side surfaces 105, 110 are electrically connected from the front junction to the back junction. More specifically, the electrical contacts are brought from the front side to the back side by means of laser cutting or reactive ion etching (RIE) a conduit 113 into the photodiode array 100. In addition, insulation layer 114 is deposited on the inner sidewalls of conduit 113.

By way of example, and by no means limiting, the insulation layer grown herein may utilize thin film materials, such as oxides, sulfides, fluorides, nitrides, and selenides, among others. In one embodiment of the present invention, the insulation layer comprises silicon dioxide. In one embodiment, the silicon dioxide layer is uniformly grown over both the front-side and the back-side of the wafer and the walls of the holes by thermal oxidation.

Conductive layer 115 is deposited over insulation layer 114 and serves as the electrical conduit to enable electrical communication between the front side p+ region 108 and back side anode 112.

In one embodiment, conductive layer 115 is doped poly-silicon. Doped poly-silicon can withstand high temperature processing, can be deposited using chemical vapor deposition methods, forms an effective ohmic contact, and resists corrosion. Insulating layer 114 and conductive layer 115 are formed on the inner sidewalls of conduit 113, and separates adjacent photodiodes. Thus, front surface p+ region 108 is in electrical communication with back side p+ anode 112 via conductive conduit 113 formed in the photodiode array.

FIGS. 2a-2d are representative front side views of a first embodiment of a photodiode array with double-sided PN-junctions formed in accordance with the present invention. Referring now to FIGS. 2a and 2b, diode elements 201 reside within photodiode array 200. In one embodiment, photodiode array 200 comprises diode elements 201 arranged in the form of an 8×8 matrix on silicon wafer 202. Although an array of a limited number of diode elements 201 is illustrated in FIG. 2a, it should be understood that an array or matrix of diode elements falling within the scope of the present invention may have any number of diode elements. A person of ordinary skill would appreciate that the number of photodiodes incorporated in the silicon wafer is not limited to the aforesaid number and can be adjusted to suit varied operational specifications.

Referring to FIG. 2a, region 203 demarcates a portion of silicon wafer 202, presented in further detail in FIG. 2b. The following specifications are provided to describe an exemplary embodiment of the present invention and are not intended to be limiting. Rather, it should be understood by those of ordinary skill in the art that any number of specifications are possible to practice the present invention. For example, but, not limited to such example, FIG. 2b illustrates that in one embodiment, pitch length 204 between two adjacent diode elements 201 is 2.500 mm, along both the length and width of silicon wafer 202. Within photodiode array 200, active regions or areas 205 of diode elements 201 serve to provide surfaces onto which light impinges. In one embodiment, the size of the active area is 2.200 mm$^2$.

In one embodiment, photodiode array 200 also possesses the following characteristics: the distance 206 between the center of active area 205 and the edge of wafer 202 is 1.285 mm; the thickness 207 of the n+ cathode at the edge of wafer 202 is 0.070 mm; and the gap 208 between the n+ edges of any two adjacent diode elements 201 is 0.050 mm.

The interconnections between diode elements 201 are made through back surface contacts (not shown). In one embodiment, wire interconnections are made at the back of photodiode array 200 and are made available for creating electrical connections with external circuits, such as printed circuit boards (PCBs) and other devices.

FIG. 2c is an expanded view of region 209 of photodiode array 200, and is further demarcated with a dotted circle. As shown in FIG. 2c, in one embodiment, photodiode array 200 also possesses the following characteristics: the gap 211 between a p+ region and an n+ region of within diode element 201 is 0.125 mm and the diameter 210 of the conduit that allows for electrical communication between the front and back surfaces of a diode element is 0.020 mm. FIG. 2d is an expanded view of Detail A shown in FIG. 2c and is an illustration of the conduit lined with a doped-polysilicon layer, as described earlier.

FIGS. 3a-3c are representative back side views of a first embodiment of a photodiode array with double-sided PN-junctions formed in accordance with the present invention. Referring now to FIG. 3a, diode elements 301 reside within photodiode array 300. Exemplary dimensional characteristics of photodiode array 300 have already been described with respect to FIGS. 2a-2d above and will not be repeated herein.

Referring now to FIG. 3b, which is an expanded view of area 303 on FIG. 3a, p+ anode 304 has a square dimension of 0.500 mm$^2$, in one embodiment. In addition, in one embodiment, n+ cathode metal contacts or regions converge from a plurality of diode elements 301 to form a circular area 305 having a diameter of 0.250 mm. In addition, the n+ cathode metal region 309 has a thickness of 0.0500 mm.

FIG. 3c is a magnified view of region 306 of FIG. 3b and is further demarcated by a dotted circle. In one embodiment, the gap 307 between the conduit for electrically connecting front and back regions and the inner edge of the n+ cathode metallic region is 0.060 mm.

The manufacturing process of the first embodiment of the FSL-BSC double-sided PN-junction photodiode of the present invention will now be described in greater detail. It should be noted herein that although one exemplary manufacturing process is described herein, various modifications may be made without departing from the scope and spirit of the invention.

Figure 4A:
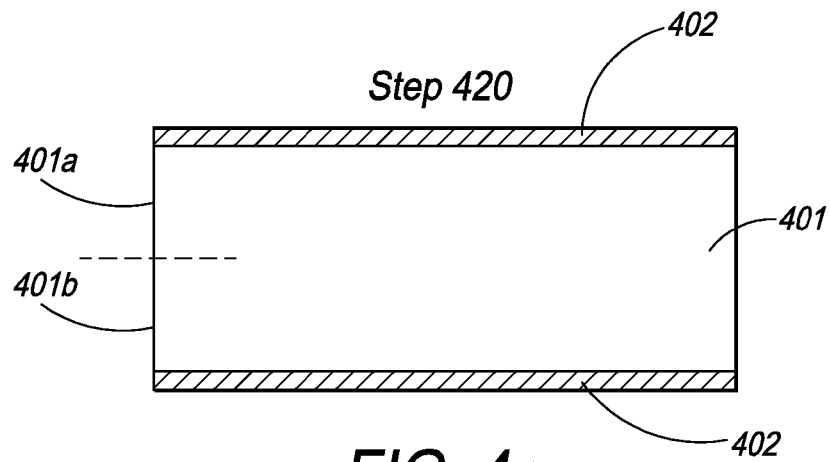
FIGS. 4a-4n depict side planar views of a first embodiment of the manufacturing steps for forming a photodiode array with double-sided PN junctions formed in accordance with the present invention.
Figure 4B:
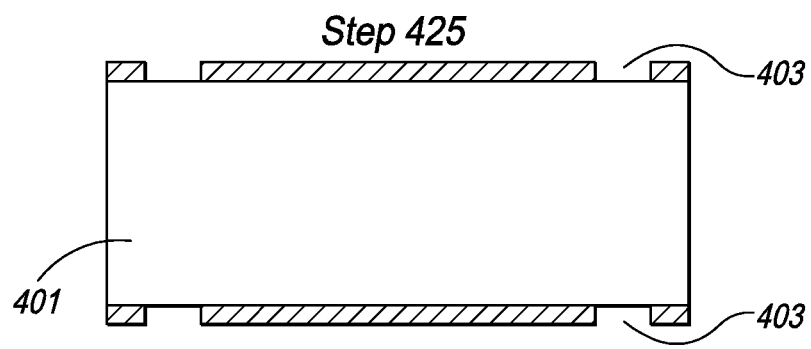
Figure 4C:
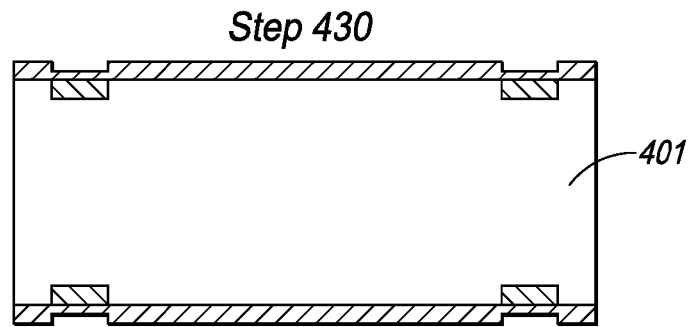
Figure 4D:
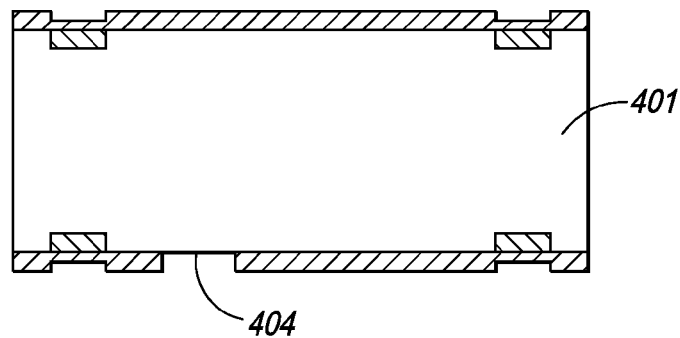
Figure 4E:
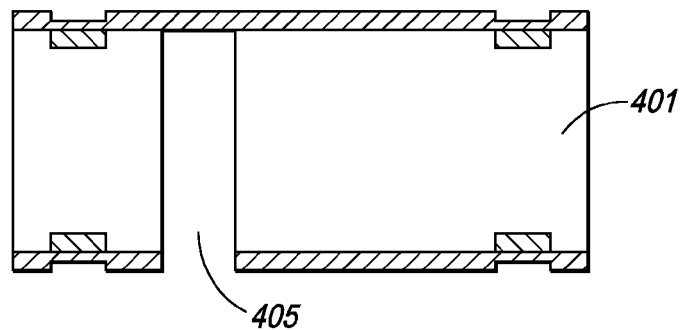
Figure 4F:
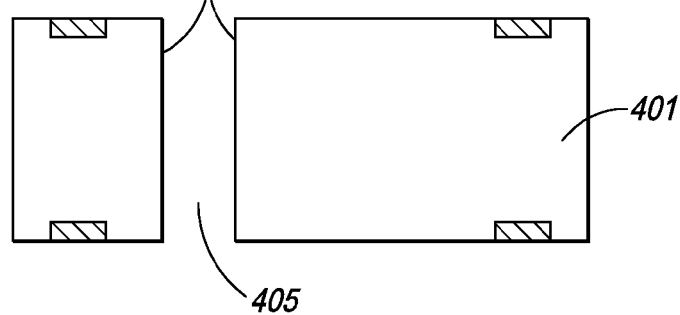
Figure 4G:
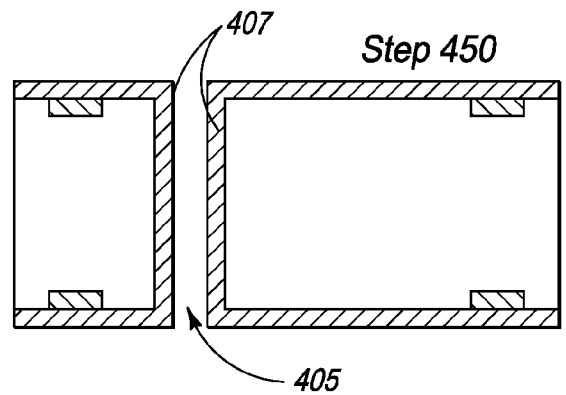
Figure 4H:
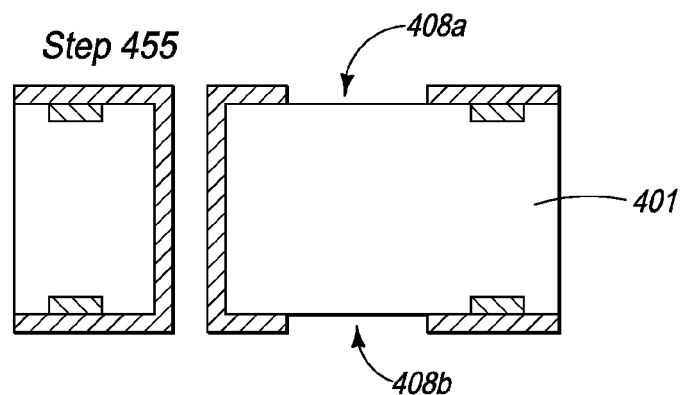
Figure 4I:
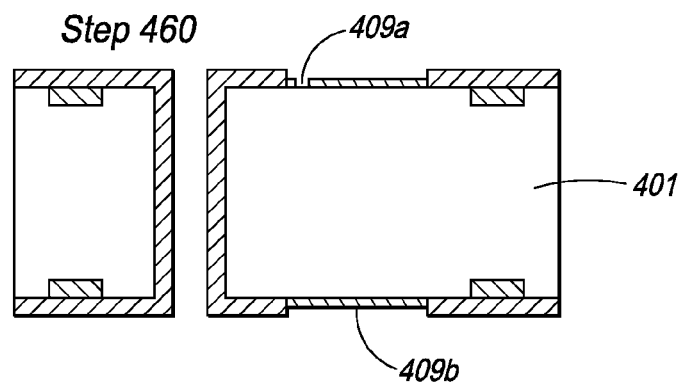
Figure 4J:
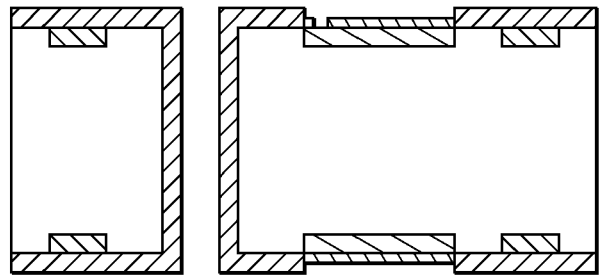
Figure 4K:
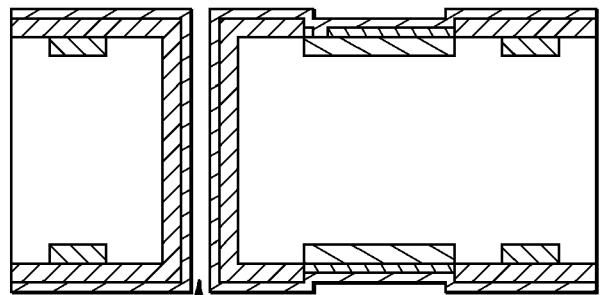
Figure 4L:
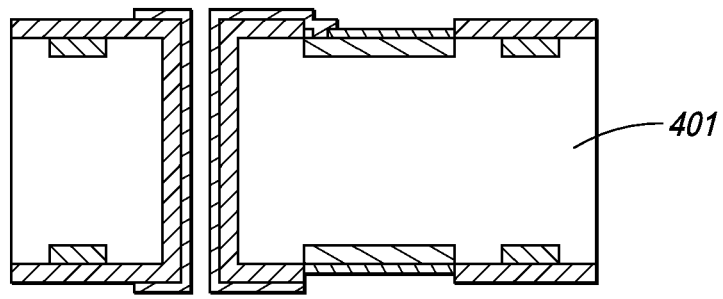
Figure 4M:
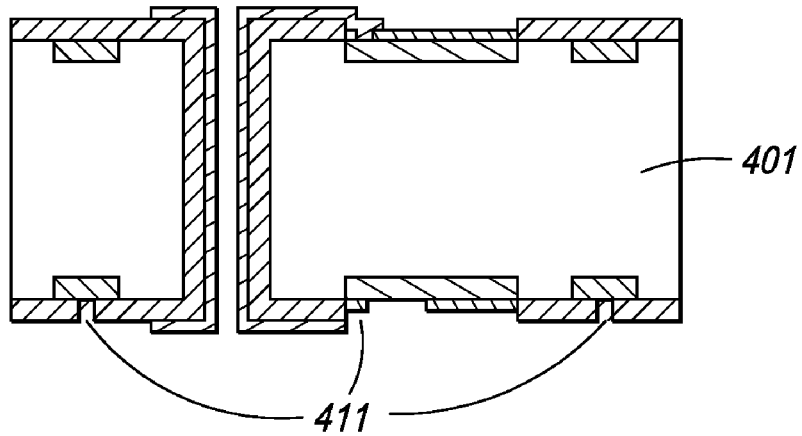
Figure 4N:
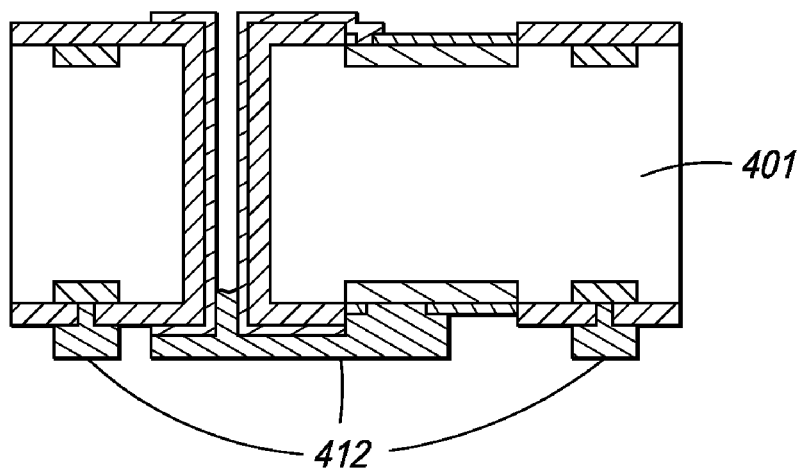

FIGS. 4a-4n depict side planar views of a first embodiment of the manufacturing steps for forming a photodiode array with double-sided PN junctions formed in accordance with the present invention.

Referring now to FIG. 4a, the starting material for the photodiode array of the present invention is device wafer 401. In one embodiment, device wafer 401 is a silicon wafer having the following specifications: a 6-inch diameter; a thickness ranging from 0.210-0.260 mm; n-type conductivity; and a resistivity on the order of 8000 Ωcm. In another embodiment, device wafer 401 is a silicon wafer having the following specifications: a 5-inch diameter; a thickness ranging from 0.210-0.260 mm; n-type conductivity; and a resistivity on the order of 8000 Ωcm. The above specifications are for the purposes of illustration, and are not limiting. Consequently these specifications may be modified to suit the design, fabrication and functional requirements suggested herein.

Although the present invention is not limited to this embodiment, the manufacturing steps of the present invention will be described with respect to device wafer 401 possessing the following specifications: n-type silicon wafer having a thickness of 0.230 mm. While it is preferred that the device wafer be comprised of silicon, one of ordinary skill in the art would appreciate that any suitable semiconductor material, which can be processed in accordance with the processing steps of the present invention, may be used.

In one embodiment, device wafer 401 is polished on both sides to allow for greater conformity to parameters, surface flatness, and specification thickness. In another embodiment, device wafer 401 has a high reflectivity layer on both sides. It should be understood by those of ordinary skill in the art, however, that the above specifications are not binding and that the type of material and wafer size can easily be changed to suit the design, fabrication, and functional requirements of the present invention.

Referring back to FIG. 4a, in step 420, raw device wafer 401 is subjected to a standard mask oxidation process that grows a mask oxide layer 402 on both the front side 401a and back side 401b of the device wafer. In one embodiment, the oxidation mask is made of $SiO_2$ or $Si_3N_4$ and thermal oxidation is employed to achieve mask oxidation. Standard mask oxidation is well known to those of ordinary skill in the art and will not be described in further detail herein.

As shown in FIG. 4b, after the standard mask oxidation is complete, the device wafer is subjected to n+ photolithography on both the front and back sides 401a, 401b of device wafer 401 in step 425. Photolithography includes employing a photoresist layer to etch a specific pattern on the surface of the wafer. Generally, the photoresist layer is a photosensitive polymeric material for photolithography and photoengraving that can form a patterned coating on a surface. After selecting a suitable material and creating a suitable photoresist pattern, a thin photoresist layer is applied to both front and back sides 401a, 401b of device wafer 401. In one embodiment, the photoresist layer is applied via a spin coating technique. Spin coating is well known to those of ordinary skill in the art and will not be described in detail herein.

The device wafer is then subjected to n+ masking. N+ masking is employed to protect portions of device wafer 401. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The photoresist coated device wafer 401 is aligned with the n+ mask. An intense light, such as ultraviolet light, is projected through the mask, exposing the photoresist layer in the pattern of the n+ mask. The n+ mask allows selective irradiation of the photoresist on the device wafer. Regions that are exposed to radiation are hardened while those that are reserved for diffusion remain shielded by the n+ mask and easily removed. The exposed and remaining photoresist is then subjected to a suitable chemical or plasma etching process to reveal the pattern transfer from the mask to the photoresist layer. An etching process is then employed to remove the silicon dioxide layer. In one embodiment, the pattern of the photoresist layer and/or n+ mask defines a plurality of regions 403 devoid of the oxide layer deposited in step 420 and ready for n+ diffusion.

Now referring to FIG. 4c, in step 430, device wafer 401 is subjected to n+ diffusion followed by drive-in oxidation after the n+ masking and etching step. Generally, diffusion facilitates propagation of a diffusing material through a host material. In a semiconductor wafer fabrication process, diffusion is employed to convert exposed portions of an n-type silicon wafer into a p-type silicon wafer, or vice versa. In step 430, an appropriate amount of dopant atoms is deposited onto the substrate wafer and fills the gaps left by the removed photoresist layer. Then, the wafer is subjected to a drive-in oxidation process that is used to redistribute the dopant atoms and deposit them deeper into the wafer. In addition, exposed silicon surfaces are oxidized.

FIGS. 4d-4f describe steps for forming a conduit that extends through the total thickness of the wafer. As shown in FIG. 4d, in step 435 the back side 401b of device wafer 401 is subjected to etch-hole lithography to remove a portion of the oxide layer to create start opening 404 through oxide layer 402 of back side 401b of device wafer 401. As shown in FIG. 4e, in step 440, hole 405 is then cut through the entire device wafer 401 using a suitable hole cutting or drilling method. As known to persons of ordinary skill in the art, methods used to form holes in substrates comprise, but are not limited to, reactive ion etching (RIE), photo patterning, and laser-based techniques, such as laser ablation, laser micromachining, and laser scribing. In one embodiment, hole 405 is cut through the wafer using reactive ion etching (RIE). In step 445, as shown in FIG. 4f, the hole forming process is completed by etching the oxide layer 402 on both the front side and back side of wafer 401, resulting in through-hole or conduit 405, formed from inner side walls 406 of device wafer 401.

Referring now to FIG. 4g, in step 450, an oxide layer 407 is grown onto the front side 401a, back side 401b and inner side walls 406 of device wafer 401.

As shown in FIG. 4h, in step 455, both front side 401a and back side 401b of device wafer 401 are subjected to a p+ lithography process, forming regions devoid of oxide layer 408a and 408b. As with any conventional lithography process, p+ lithography comprises at least the following tasks, but not limited to such tasks: substrate preparation; photoresist application; soft baking; mask alignment; exposure; development; hard backing; and etching. In addition, various other chemical treatments may be performed.

In step 460, shown in FIG. 4i, anti-reflective layer 409a and 409b are grown, via thermal oxidation, on both front side 401a and back side 401b of device wafer 401, respectively, covering regions 408a and 408b. Various anti-reflective coating designs, such as 1 layer, 2 layer, 3 layer, and 4+ layer may be employed. By way of example, and by no means limiting, the 1-layer anti-reflective coating design adopted herein utilizes thin film materials, such as oxides, sulfides, fluorides, nitrides, selenides, metals, among others. In one embodiment of the present invention, the anti-reflective layer comprises silicon dioxide antireflective ($SiO_2$ AR).

A contact etch mask is then employed to etch a contact window 410 into antireflective layer 409a on front side 401a of device wafer 401. The contact window is formed on the front side of the treated substrate wafer by using standard semiconductor technology photolithography techniques. The contact window oxide can then be removed by either standard wet or standard dry etching techniques as are well known to those of ordinary skill in the art.

More specifically, and not limited to such example, in one embodiment of the photodiode array of the present invention, a contact window mask is first applied, followed by etching with a contact window oxide. Contact lithography, well known to those of ordinary skill in the art, involves printing an image or pattern via illumination of a photomask in direct contact with a substrate coated with an imaging photoresist layer. Typically, a contact window is an aperture defined in a surface passivation layer through which device metallization develops contact with circuit elements. In one embodiment, the contact window mask is a dark field mask, which is used to remove the silicon oxide layer in regions requiring contacts. While contact masks have conventionally been fairly large (on the order of 100 mm or higher), it is possible that alignment tolerances may necessitate smaller mask sizes to allow stepping between exposures. As in nano-imprint lithography, the mask needs to have roughly the same feature size as the desired image.

Using the contact mask, at least one contact window 410 is formed through the antireflective oxide layer 409a on front side 401a of device wafer 401. In one embodiment, contact window etching is achieved via a chemical etching process, wherein the wafer is immersed in buffered oxide etch (BOE), a HF acid-based solution for intervals sufficient to remove the layers exposed by the contact window mask.

As shown in FIG. 4j, regions 408a and 408b are subjected to p+ masking and ion implantation through the AR layer in step 465, thus forming PN-junctions. The p+ masking process is standard in semiconductor technology and will not be described in detail herein. The p+ masking process of step 465 further comprises ion implantation and thermal annealing, resulting in the formation of PN-junctions. In one embodiment, the p+ dopant is boron. Once the p+ dopant is implanted and annealed, the PN-junction formation is complete.

In step 470, shown in FIG. 4k, the oxide coated front side 401a and back side 401b and sidewalls 406 of hole 405 are subjected to a poly-silicon layer deposition followed by doping the poly-silicon layer with a material of selected conductivity type, such as n-type or p-type. In one embodiment, the layer of poly-silicon is doped with boron.

As shown in FIG. 4l, in step 475, front side 401a and back side 401b of device wafer 401 are subjected to a standard poly-silicon photolithography process as is well known to those of ordinary skill in the art, which results in the removal of the polysilicon layer from portions of device wafer 401.

In step 480, shown in FIG. 4m, contact window lithography is performed to etch contact windows 411 on the back side 401b of device wafer 401 to form a metal connection to the n+ and p+ diffused areas on the backside.

Referring now to FIG. 4n, in step 485, device wafer 401 is subjected to a metal deposition process to etch metal on the back side 401b of the wafer for creating electrical connections to n+ and p+ diffused areas. In the metal deposition process, also called metallization, metal layers 412 are deposited on the wafer to create conductive pathways. The most common metals include aluminium, nickel, chromium, gold, germanium, copper, silver, titanium, tungsten, platinum, and tantalum. Selected metal alloys may also be used. Metallization is often accomplished with a vacuum deposition technique. The most common deposition process include filament evaporation, electron-beam evaporation, flash evaporation, induction evaporation, and sputtering, followed by metal masking and etching. Metal etching can be performed in a variety of methods, including, but not limited to abrasive etching, dry etching, electroetching, laser etching, photo etching, reactive ion etching (RIE), sputter etching, and vapor phase etching.

Figure 5:
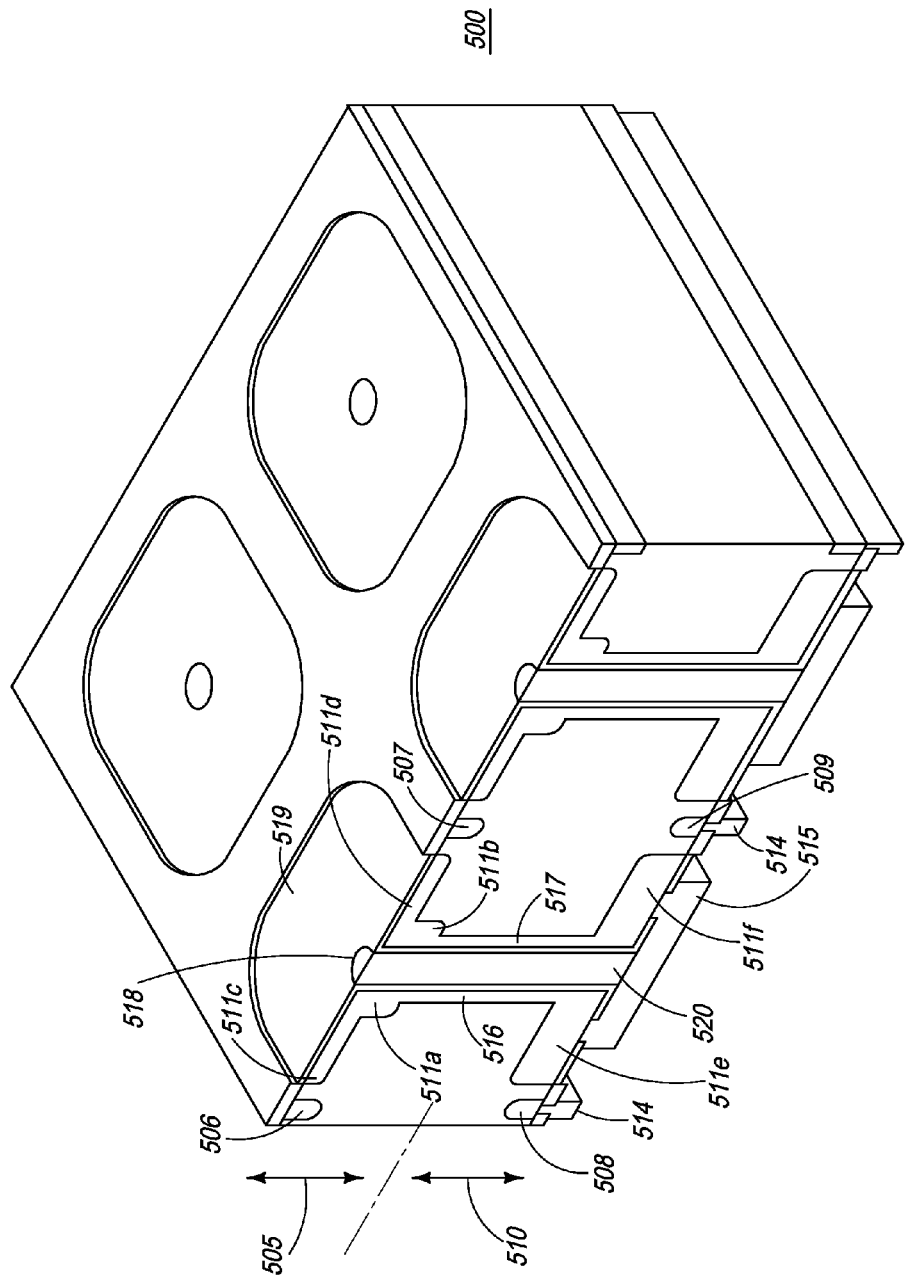
FIG. 5 is a cross-sectional view of a second embodiment of a photodiode array with double-sided PN junctions formed in accordance with the present invention.

FIG. 5 is a cross-sectional view of a second embodiment of a front-side illuminated, back-side contact (FSL-BSC) double-sided PN-junction photodiode array formed in accordance with the present invention. In the second embodiment, a front to back electrical connection is established by etching a conduit or hole through the device wafer and doping the walls of the resulting hole with a p+ dopant. The holes can optionally be filled with polysilicon or polyimide to strengthen the photodiode array. In one embodiment, photodiode array 500 is preferably formed from a wafer of suitable semiconductor material. Suitable semiconductor starting materials have been described with respect to the first embodiment above and will not be repeated herein.

In one embodiment, photodiode array 500 is formed from a silicon wafer having a 6-inch diameter; a thickness of 0.230 mm; n-type conductivity; and a resistivity on the order of 8000 Ωcm. As shown in FIG. 5, for illustration purposes, at least a portion of photodiode array 500 is divided into two regions, front-side region 505 and back side region 510. It should be understood by those of ordinary skill in the art that any number of regions having variable respective thicknesses may be selected as suitable for the FSL-BSC double-sided PN-junction photodiode of the present invention. Thus, the above specifications are not limited to those recommended herein and can be easily changed to suit varying design, fabrication, and functional requirements suggested herein.

In one embodiment, the front side region 505 and back side region 510 comprise a plurality of doped regions. Preferably, adjacent doped regions are of different impurities of different conductivity types. For example, but not limited to such example, front side region 505 and back side region 510 may comprise heavily doped regions 506, 507, 508, and 509 doped with a suitable impurity of a first conductivity type, such as either p-type or n-type. In addition, front side region 505 and back side region 510 further comprise diffused regions 511a, 511b, 511c, 511d, 511e, and 511f, doped with a suitable impurity of a second conductivity type, opposite that of the first conductivity type, either p-type or n-type.

For example, but not limited to such example, if regions 506, 507, 508, and 509 are doped with a suitable impurity of a first conductivity type wherein the first conductivity type is n-type, then regions 511a, 511b, 511c, 511d, 511e, and 511f are doped with a suitable impurity of a second conductivity type, wherein the second conductivity type is p-type. The second embodiment will be described with respect to this scenario, but it should be noted herein that the photodiode array of the present invention and method of manufacturing the same is not limited to the embodiment described herein.

In one embodiment, the present invention comprises PN-junctions on both front and back sides of the wafer. While boron (B) and phosphorus (P) are the preferred p-type and n-type dopants employed to create the p+ and n+ regions, it should be understood to those of ordinary skill in the art that any suitable doping material may be used. Preferably, doped diffusion regions 511a, 511b, 511e, and 511f have a depth of 2 μm. Preferably, doped diffusion regions 511c and 511d have a depth of approximately 0.5 μm. In one embodiment, regions 511a and 511b are more deeply diffused compared to regions 511c and 511d.

Referring back to FIG. 5, back side n+ regions 508 and 509 are in electrical communication with metallic area, region, or pad to form a back side cathode 514. Back side region p+ layer 511e and 511f are in electrical communication, preferably at a plurality of points, with a metallic area, region, or pad to form a back side anode 515.

The PN-junctions on both the front side and back side surfaces are electrically connected from the front junction to the back junction. More specifically, the electrical contacts are brought from the front side to the back side by means of laser cutting or silicon dry etching a conduit 518 into the photodiode array 500. To serve as an electrical conduit to enable electrical communication between the p+ region 511e and 511f and back side anode 515, the inner walls 516 and 517 of the conduit 518 are doped with a suitable conducting material. In one embodiment, the suitable conductor is a p-type material, such as, but not limited to boron.

In addition, an oxide layer 519 is deposited on the inner sidewalls of conduit 518 after it is doped. Polysilicon or polyimide layer 520 is deposited over the oxide layer 519 and serves as a support layer to increase the ruggedness of the device.

FIGS. 6a-6d are representative front side views of a second embodiment of a photodiode array with double-sided PN-junctions formed in accordance with the present invention. Referring now to FIGS. 6a and 6b, diode elements 601 reside within photodiode array 600. In one embodiment, photodiode array 600 comprises diode elements 601 arranged in the form of a 8×8 matrix on silicon wafer 602. Although an array of a limited number of diode elements 601 is illustrated in FIG. 6a, it is understood that an array or matrix of diode elements falling within the scope of the present invention may have any number of diode elements. A person of ordinary skill would appreciate that the number of photodiodes incorporated in the silicon wafer is not limited to the aforesaid number and can be adjusted to suit varied operational specifications.

Referring to FIG. 6a, region 603 demarcates a portion of silicon wafer 602, presented in further detail in FIG. 6b. The following specifications are provided to describe an exemplary embodiment of the present invention and are not intended to be limiting. Rather, it should be understood by those of ordinary skill in the art that any number of specifications are possible to practice the present invention.

For example, but, not limited to such example, FIG. 6b illustrates that in one embodiment, pitch length 604 between two adjacent diode elements 601 is 2.500 mm, along both the length and width of silicon wafer 602. Within photodiode array 600, active regions or areas 605 of diode elements 601 serve to provide surfaces onto which light impinges. In one embodiment, the size of the active area is 2.200 mm².

In one embodiment, photodiode array 600 also possesses the following characteristics: the distance 606 between the center of active area 605 and the edge of wafer 602 is 1.285 mm; the gap 607 between a p+ edge of a diode element 601 and edge of wafer 602 is 0.185 mm; and the gap 608 between the n+ edges of any two adjacent diode elements 601 is 0.050 mm.

The interconnections between diode elements 601 are made through back surface contacts (not shown). In one embodiment, wire interconnections are made at the back of photodiode array 600 and are made available for creating electrical connections with external circuits, such as printed circuit boards (PCBs) and other devices.

FIG. 6c is an expanded view of region 609 of photodiode array 600, and is further demarcated with a dotted circle. As shown in FIG. 6c, in one embodiment, photodiode array 600 also possesses the following characteristics: the gap 609 between p+ regions of two adjacent diode elements 601 is 0.300 mm and the gap 610 between two n+ regions of two adjacent diode elements 601 is 0.050 mm. FIG. 6d is an expanded view of Detail A shown in FIG. 6c and is an exemplary illustration of a conduit for forming electrical connections from the front side of the device to the back side of the device. As described above, the conduit has an exemplary diameter of 0.020 mm and is preferably lined with a doped-polysilicon layer.

FIGS. 7a-7c are representative back side views of a first embodiment of a photodiode array with double-sided PN-junctions formed in accordance with the present invention. Referring now to FIG. 7a, diode elements 701 reside within photodiode array 700. The preferred dimensional characteristics of photodiode array 700 have already been described with respect to FIGS. 6a-6d above and will not be repeated herein.

Referring now to FIG. 7b, which is an expanded view of area 703 on FIG. 7a, p+ anode 704 has an exemplary square dimension of 0.500 mm². In addition, n+ cathode metal contacts or regions converge from a plurality of diode elements 701 to form a circular area 705 having a diameter of 0.250 mm in one embodiment. In addition, the n+ cathode metal region has a thickness of 0.0500 mm.

FIG. 7c is a magnified view of region 706 of FIG. 3b and is further demarcated by a dotted circle. In one embodiment, the gap 607 between the p+ edges of adjacent diode elements 701 is 0.300 mm. In another embodiment, the preferred thickness 708 of the cathode metal between adjacent diode elements is 0.050 mm.

The manufacturing process of the second embodiment of the FSL-BSC double-sided PN-junction photodiode of the present invention will now be described in greater detail. It should be noted herein that although one exemplary manufacturing process is described herein, various modifications may be made without departing from the scope and spirit of the invention.

Figure 8A:
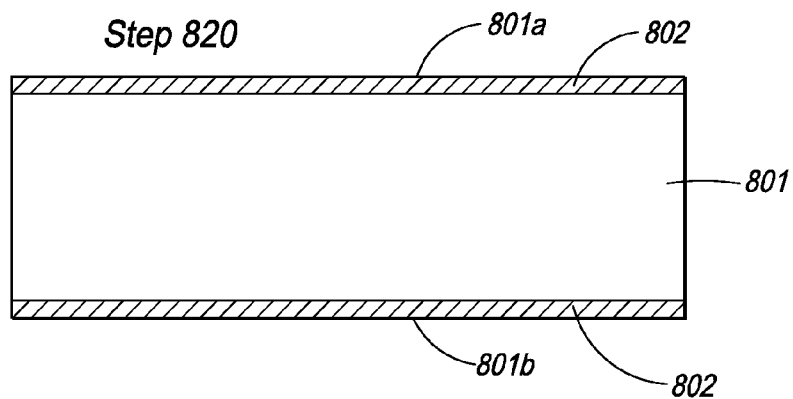
FIGS. 8a-8n depict side planar views of a second embodiment of the manufacturing steps for forming a photodiode array with double-sided PN junctions formed in accordance with the present invention.
Figure 8B:
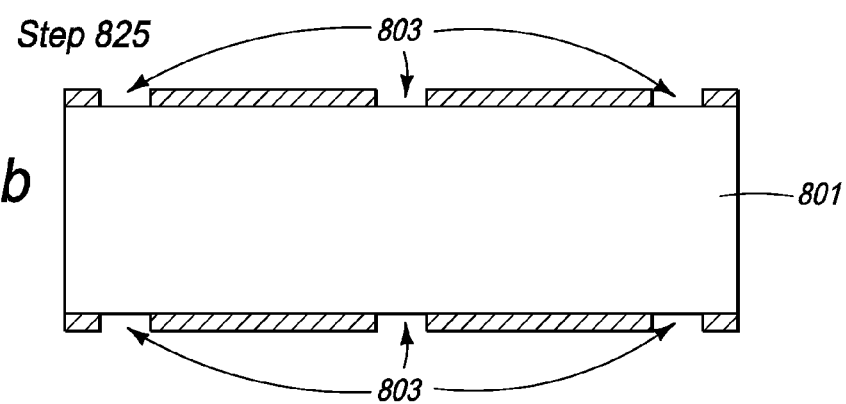
Figure 8C:
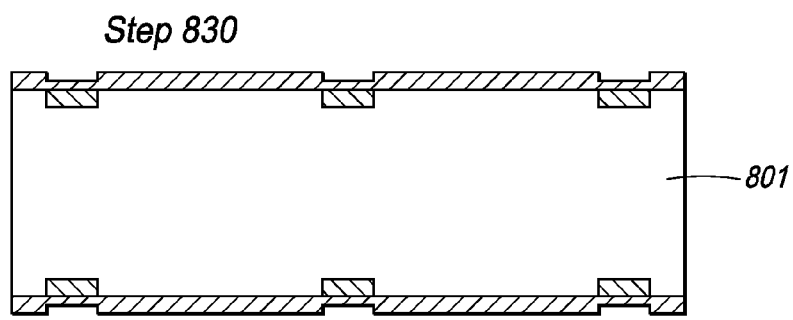
Figure 8D:
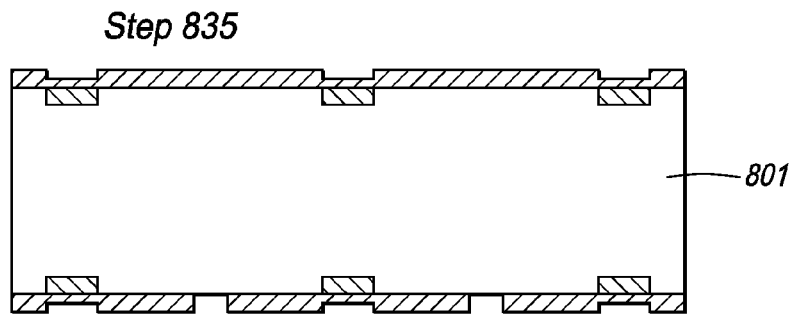
Figure 8E:
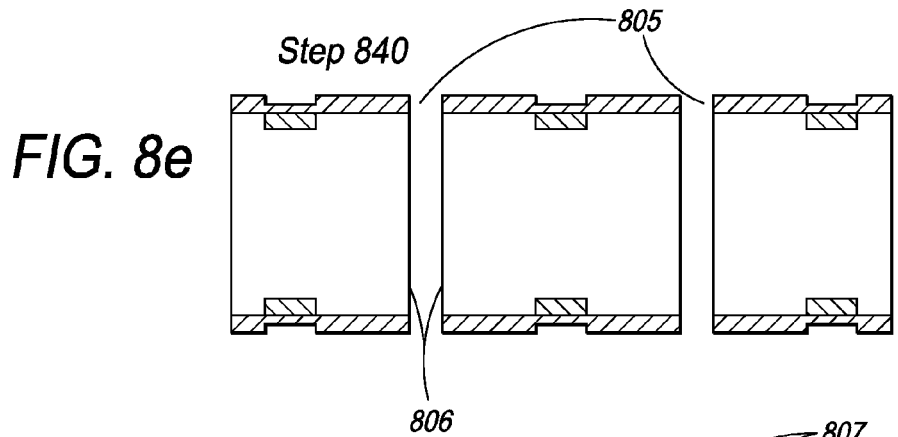
Figure 8F:
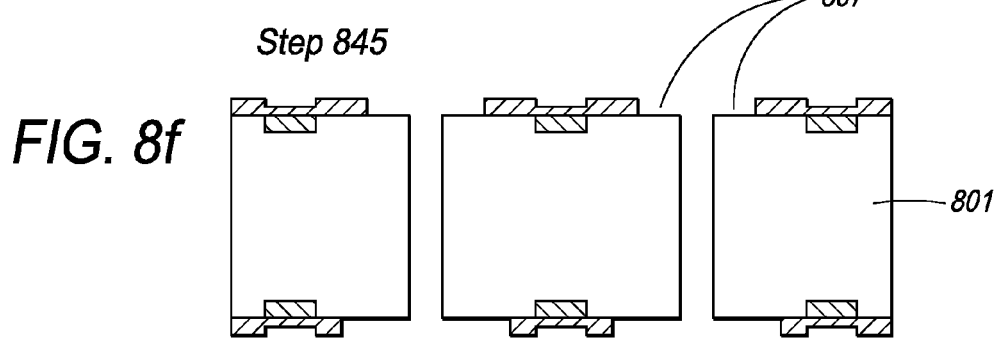
Figure 8G:
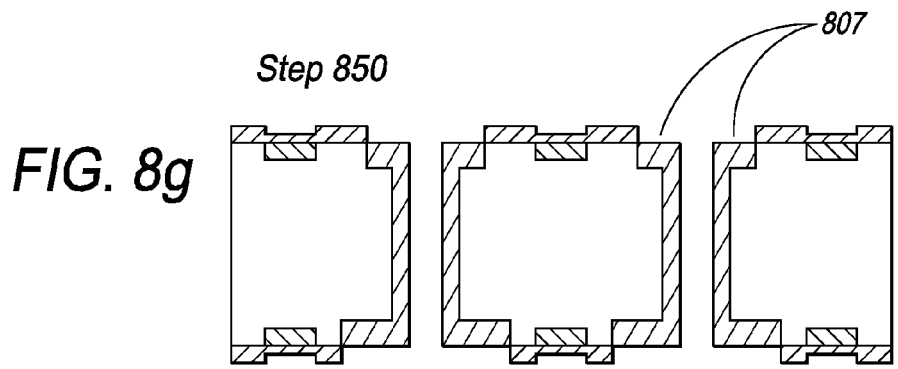
Figure 8H:
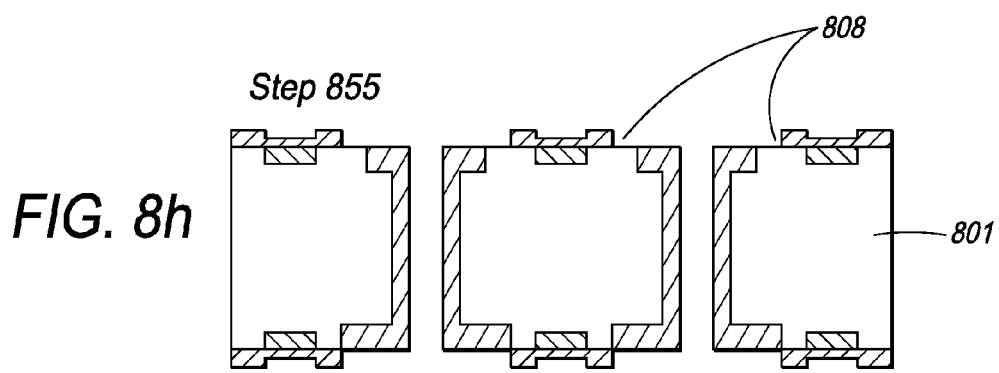
Figure 8I:
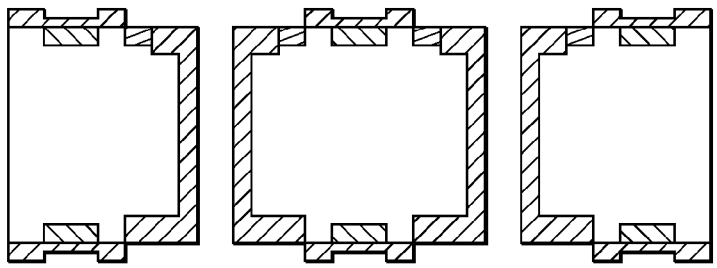
Figure 8J:
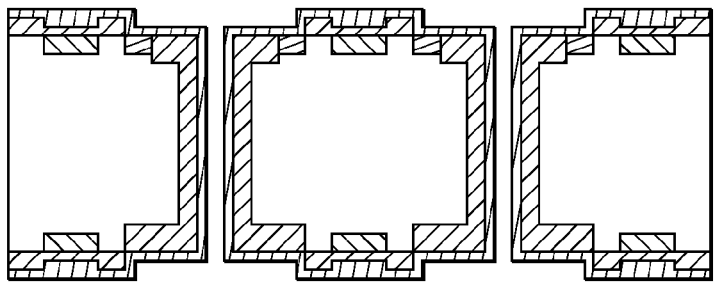
Figure 8K:
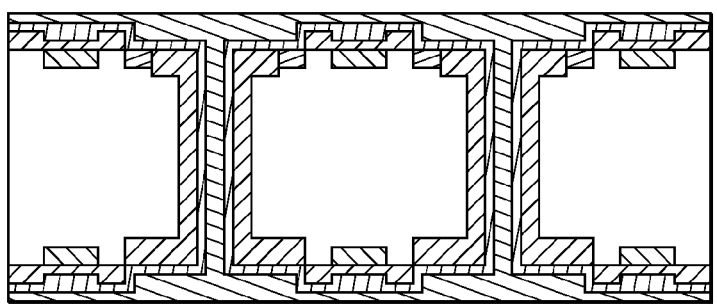
Figure 8L:
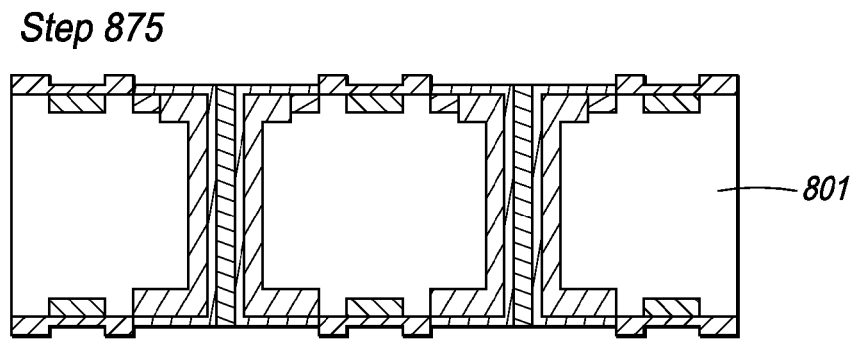
Figure 8M:
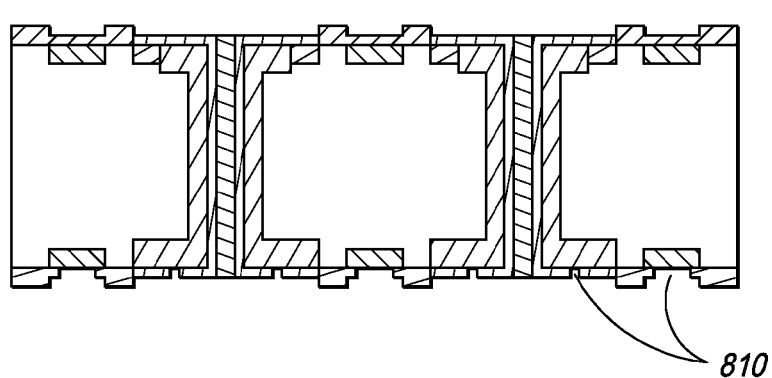
Figure 8N:
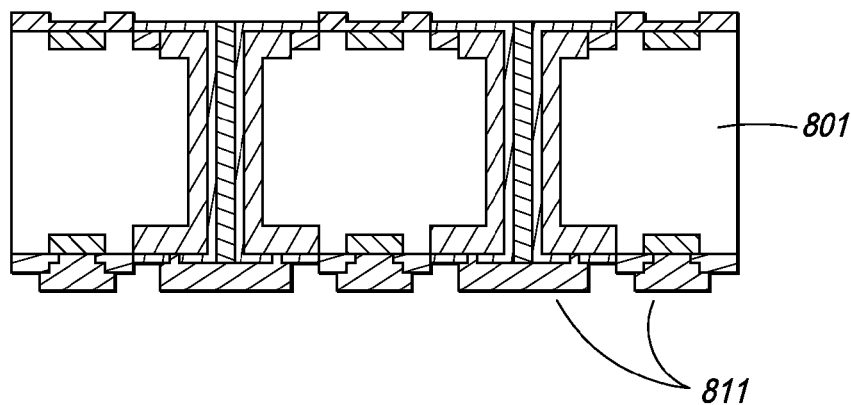

FIGS. 8a-8n depict side planar views of a first embodiment of the manufacturing steps for forming a photodiode array with double-sided PN junctions formed in accordance with the present invention.

Referring now to FIG. 8a, the starting material for the photodiode array of the present invention is device wafer 801. In one embodiment, device wafer 801 is a silicon wafer having the following specifications: a 6-inch diameter; a thickness ranging from 0.210-0.260 mm; n-type conductivity; and a resistivity on the order of 8000 Ωcm. In another embodiment, device wafer 801 is a silicon wafer having the following specifications: a 5-inch diameter; a thickness ranging from 0.210-0.260 mm; n-type conductivity; and a resistivity on the order of 8000 Ωcm. The above specifications are merely for the purposes of illustration, and are not limiting. Consequently these specifications may be modified to suit the design, fabrication and functional requirements suggested herein.

Although the present invention is not limited to this embodiment, the manufacturing steps of the present invention will be described with respect to device wafer 801 possessing the following specifications: n-type silicon wafer having a thickness of 0.230 mm. While it is preferred that the device wafer be comprised of silicon, one of ordinary skill in the art would appreciate that any suitable semiconductor material, which can be processed in accordance with the processing steps of the present invention, may be used.

In one embodiment, device wafer 801 is polished on both sides to allow for greater conformity to parameters, surface flatness, and specification thickness. It should be understood by those of ordinary skill in the art, however, that the above specifications are not binding and that the type of material and wafer size can easily be changed to suit the design, fabrication, and functional requirements of the present invention.

Referring back to FIG. 8a, in step 820, raw device wafer 801 is subjected to a standard mask oxidation process that grows a mask oxide layer 802 on both the front side 801a and back side 801b of the device wafer. In one embodiment, the oxidation mask is made of $SiO_2$ or $Si_3N_4$ and thermal oxidation is employed to achieve mask oxidation. Standard mask oxidation is well known to those of ordinary skill in the art and will not be described in further detail herein.

As shown in FIG. 8b, after the standard mask oxidation is complete, the device wafer is subjected to n+ photolithography on both the front and back sides 801a, 801b of device wafer 801 in step 825. Photolithography includes employing a photoresist layer to etch a specific pattern on the surface of the wafer. Generally, the photoresist layer is a photosensitive polymeric material for photolithography and photoengraving that can form a patterned coating on a surface. After selecting a suitable material and creating a suitable photoresist pattern, a thin photoresist layer is applied to both front and back sides 801a, 801b of device wafer 801. In one embodiment, the photoresist layer is applied via a spin coating technique. Spin coating is well known to those of ordinary skill in the art and will not be described in detail herein.

The device wafer is then subjected to n+ masking. N+ masking is employed to protect portions of device wafer 801. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The photoresist coated device wafer 801 is aligned with the n+ mask. An intense light, such as ultraviolet light, is projected through the mask, exposing the photoresist layer in the pattern of the n+ mask. The n+ mask allows selective irradiation of the photoresist on the device wafer. Regions that are exposed to radiation are hardened while those that are reserved for diffusion remain shielded by the n+ mask and easily removed. The exposed and remaining photoresist is then subjected to a suitable chemical or plasma etching process to reveal the pattern transfer from the mask to the photoresist layer. An etching process is then employed to remove the silicon dioxide layer. In one embodiment, the pattern of the photoresist layer and/or n+ mask defines a plurality of regions 803 devoid of the oxide layer deposited in step 820 and ready for n+ diffusion.

As shown in FIG. 8c, in step 830, device wafer 801 is subjected to n+ diffusion followed by drive-in oxidation. In step 830, an appropriate amount of a dopant such as, but not limited to phosphorus, is deposited onto the substrate wafer. The device wafer 801 is then subjected to a drive-in oxidation process that is used to redistribute the dopant atoms and deposit them deeper into the wafer. In addition, exposed silicon surfaces are oxidized.

FIGS. 8d and 8e describe steps for forming a conduit that extends through the total thickness of the wafer. As shown in FIG. 8d, in step 835 the back side 801b of device wafer 801 is subjected to laser hole lithography to form an opening 804 in oxide layer 802 of back side 801b of device wafer 801. As shown in FIG. 8e, in step 840, holes 805 are cut through the entire device wafer 801 using a suitable hole cutting method.

As known to persons of ordinary skill in the art, methods used to form holes in substrates comprise, but are not limited to, reactive ion etching (RIE), photo patterning, and laser-based techniques, such as laser ablation, laser micromachining, and laser scribing. Lasers offer considerable flexibility and precision focus, thereby making it an effective means for forming small diameter holes, such as micro-holes having diameter of the order of approximately 20 to 30 µm. Preferred apparatuses, methods or systems perform laser-scribing via a Yttrium-Aluminum-Garnet (YAG) solid state laser (Q switched or pulsed), for example Neodymium (Nd:YAG) laser, Erbium (Er:YAG) laser or Holmium (Ho:YAG) laser, operating at a suitable wavelength to form micro-structures, such as trenches, kerfs, or holes. In one preferred embodiment, to form the holes, a Nd:YAG laser having a suitable emitted beam wavelength and electrical efficiency is used.

In one embodiment, holes 805 are cut through the wafer using laser drilling, resulting in through hole 805, formed from inner side walls 806 of device wafer 801.

It should be noted herein that the reactive ion etching (RIE) and laser hole drilling processes are generally interchangeable. RIE is capable of achieving very small holes with smooth walls, approximately on the order of 20 µm in diameter. Laser hole drilling typically results in larger holes, with rough walls. The choice of process involves many factors, including cost, as the RIE process is generally more expensive than the laser hole drilling process. For the embodiments described herein, the appropriate hole formation method is outlined, and in some cases, are not limited to design specifications.

Referring now to FIG. 8f, in step 845, both front side 801a and back side 801b of device wafer 801 is subjected to a first p+ lithography process, forming regions 807, devoid of the oxide layer. The p+ lithography process has already been described with respect to the first embodiment above and will not be repeated herein.

In step 850, as shown in FIG. 8g, regions 807 and sidewalls 806 are subjected to heavy p+ diffusion followed by drive-in oxidation. In one embodiment, the p+ diffusion material is boron. Thus, the inner side walls 806 formed from laser hole cutting or reactive ion etching into device 801 are doped with a suitable p-type dopant.

In FIG. 8h, a second p+ mask lithography step 855 is performed on the front side 801a of device wafer 801, forming regions 808 devoid of oxide layer. In step 860, shown in FIG. 8i, a shallow diffusion is performed, followed by drive-in oxidation. In one embodiment, the diffusion material is boron. Step 860 results in shallow p+ diffusion regions 809.

Referring to FIG. 8j, in step 865, an anti-reflective (AR) layer is grown on the front side 801a and back side 801b of device wafer 801, as wells as side walls 806, formed in step 840. Thereafter, a polysilicon layer is deposited or polymide layer is spun on using a standard spin coating process in step 870 to fill the plurality of holes formed in step 840 a shown in FIG. 8k.

In step 875, as shown in FIG. 8l, front side 801a and back side 801b of device wafer 801 is subjected to a standard poly-silicon photolithography process, as is well known to those of ordinary skill in the art. Step 875 serves to etch the polysilicon layer from regions of device wafer 801, while retaining the polysilicon in the holes formed from sidewalls 806. In one embodiment, undoped polysilicon is employed to give greater strength to the photodiode array.

In step 880, as shown in FIG. 8m, a contact etch mask is used to etch a plurality of contact windows 810 into the back side 801b of the device wafer 801, forming electrical connections to n+ and p+ diffused areas. The contact window is formed on the back side 801b of the treated substrate wafer by using standard semiconductor technology photolithography techniques. The contact window oxide can then be removed by either standard wet or standard dry etching techniques as are well known to those of ordinary skill in the art.

Now referring to FIG. 8n, in step 885, the device wafer 801 is subjected to metal deposition process to etch metal on the back side of the wafer for creating electrical connections to n+ and p+ diffused areas. In the metal deposition process, also called metallization, metal layers 811 are deposited on the wafer to create conductive pathways. The metal deposition process has already been described with respect to the first embodiment manufacturing steps above and will not be repeated herein.

The above discussion is aimed towards providing several exemplary embodiments incorporating the novel aspects of the present invention and it should be understood that the foregoing illustration is not the only application where the present invention can be reduced down to practice. The present invention can be suitably modified to incorporate other possible embodiments as well. The scope of the invention is defined solely by the accompanying claims and within the scope of the claims; the present invention can be employed in various other situations.

We claim:

1. A photodiode comprising:
    a substrate with at least a front side and a back side;
    at least one PN-junction on the front side;
    at least one PN-junction on the back side; and
    at least one conduit for forming an electrical connection from a PN-junction on the front side of the substrate to a PN-junction on the back side of the substrate, wherein the conduit comprises a) a p+ dopant layer and b) a polysilicon or polyimide filling, wherein said photodiode is manufactured from a silicon wafer having a thickness ranging from 0.210-0.260 mm and n-type conductivity, wherein said photodiode is divided into a front-side region and a back side region, wherein each of said front side region and said back side region comprise at least two doped diffusion regions, and wherein at least one doped diffusion region has a depth of approximately 1 µm.

2. A photodiode comprising:
    a substrate with at least a front side and a back side;
    at least one PN-junction on the front side;
    at least one PN-junction on the back side; and
    at least one conduit for forming an electrical connection from a PN-junction on the front side of the substrate to a PN-junction on the back side of the substrate, wherein the conduit comprises a) a p+ dopant layer and b) a polysilicon or polyimide filling, wherein said photodiode is manufactured from a silicon wafer having a thickness ranging from 0.210-0.260 mm and n-type conductivity, wherein said photodiode is divided into a front-side region and a back side region, wherein each of said front side region and said back side region comprise at least two doped diffusion regions, and wherein at least one doped diffusion regions has a depth of approximately 0.5 µm.

3. The photodiode of claim 1 wherein at least one of said doped diffusion regions in the back side region is in electrical communication with a metallic area to form at least one back side cathode.

4. The photodiode of claim 3 wherein an inner edge of said cathode and said conduit are separated by a gap of approximately 0.060 mm.

5. The photodiode of claim 3 wherein said doped diffusion region in the back side region in electrical communication with a metallic area to form at least one back side cathode is an n-type doped diffusion region.

6. The photodiode of claim 1 wherein at least one of said doped diffusion regions in the back side region is in electrical communication with a metallic area to form at least one back side anode.

7. The photodiode of claim 6 wherein said doped diffusion region in the back side region in electrical communication with a metallic area to form at least one back side anode is an p-type doped diffusion region.

8. A photodiode comprising:
    a substrate with at least a front side and a back side;
    at least one PN-junction on the front side;
    at least one PN-junction on the back side; and
    at least one conduit for forming an electrical connection from a PN-junction on the front side of the substrate to a PN-junction on the back side of the substrate, wherein the conduit comprises a) a p+ dopant layer and b) a polysilicon or polyimide filling, wherein said photodiode is manufactured from a silicon wafer having a thickness ranging from 0.210-0.260 mm and n-type conductivity, wherein said photodiode is divided into a front-side region and a back side region, wherein each of said front side region and said back side region comprise at least two doped diffusion regions, wherein one of said at least two doped regions has a p-type conductivity and one of said at least two doped regions has an n-type conductivity, and wherein said p-type conductivity doped region and said n-type conductivity doped region are separated by a gap of approximately 0.125 mm.

9. The photodiode of claim 8 wherein said conduit has a diameter of approximately 0.020 mm.

10. A photodiode comprising:
    a substrate with at least a front side and a back side;
    at least one PN-junction on the front side;
    at least one PN-junction on the back side; and
    at least one conduit for forming an electrical connection from a PN-junction on the front side of the substrate to a PN-junction on the back side of the substrate, wherein the conduit comprises a) a p+ dopant layer and b) a polysilicon or polyimide filling, wherein said photodiode is manufactured from a silicon wafer having a thickness ranging from 0.210-0.260 mm and n-type conductivity, wherein said photodiode is divided into a front-side region and a back side region, wherein each of said front side region and said back side region comprise at least two doped diffusion regions, wherein at least one of said doped diffusion regions in the back side region is in electrical communication with a metallic area to form at least one back side cathode, and wherein an inner edge of said cathode and said conduit are separated by a gap of approximately 0.060 mm.

11. The photodiode of claim 2 wherein at least one of said doped diffusion regions in the back side region is in electrical communication with a metallic area to form at least one back side cathode.

12. The photodiode of claim 11 wherein an inner edge of said cathode and said conduit are separated by a gap of approximately 0.060 mm.

13. The photodiode of claim 11 wherein said doped diffusion region in the back side region in electrical communication with a metallic area to form at least one back side cathode is an n-type doped diffusion region.

14. The photodiode of claim 2 wherein at least one of said doped diffusion regions in the back side region is in electrical communication with a metallic area to form at least one back side anode.

15. The photodiode of claim 14 wherein said doped diffusion region in the back side region in electrical communication with a metallic area to form at least one back side anode is an p-type doped diffusion region.

* * * * *